United States Patent [19]
Abe et al.

[11] Patent Number: 5,987,075
[45] Date of Patent: Nov. 16, 1999

[54] FSK SIGNAL RECEIVER

[75] Inventors: Katsuaki Abe; Takaaki Kishigami, both of Kawasaki; Masahiro Mimura; Makoto Hasegawa, both of Tokyo; Katsushi Yokozaki, Yokohama; Yoichi Yamaki, Yokohama; Toshiyuki Tsumura, Yokohama; Hiroshi Katayama, Yokohama, all of Japan

[73] Assignee: Matsushita Electric Industrial Co., Ltd., Osaka, Japan

[21] Appl. No.: 08/988,209

[22] Filed: Dec. 10, 1997

Related U.S. Application Data

[62] Division of application No. 08/548,373, Nov. 1, 1995, Pat. No. 5,781,588.

[30] Foreign Application Priority Data

| Nov. 10, 1994 | [JP] | Japan | 6-276442 |
| Nov. 10, 1994 | [JP] | Japan | 6-276443 |
| Nov. 10, 1994 | [JP] | Japan | 6-276444 |
| Jun. 20, 1995 | [JP] | Japan | 7-152876 |

[51] Int. Cl.$^6$ ............................................. H04L 27/14
[52] U.S. Cl. ........................ 375/334; 375/324; 375/325; 375/345; 329/300
[58] Field of Search ............................... 375/224, 225, 375/324–326, 334, 344, 345; 329/300; 455/226.1, 226.3

[56] References Cited

U.S. PATENT DOCUMENTS

| 4,328,587 | 5/1982 | Mizuno et al. | 375/344 |
| 4,897,857 | 1/1990 | Wakatsuki et al. | 375/334 X |
| 5,208,835 | 5/1993 | Weeks | 375/272 |
| 5,241,568 | 8/1993 | Fernandez et al. | 375/368 |
| 5,311,554 | 5/1994 | Morera et al. | 375/316 |
| 5,323,425 | 6/1994 | Colamonico | 375/345 |
| 5,438,591 | 8/1995 | Oie et al. | 375/261 |
| 5,455,536 | 10/1995 | Kono et al. | 329/325 |
| 5,490,179 | 2/1996 | Ong | 375/345 |
| 5,561,673 | 10/1996 | Takai et al. | 371/5.5 |
| 5,621,767 | 4/1997 | Brandt et al. | 375/344 |

FOREIGN PATENT DOCUMENTS 61-141228  6/1986  Japan .

*Primary Examiner*—Young T. Tse
*Attorney, Agent, or Firm*—Lowe Hauptman Gopstein Gilman & Berner

[57] ABSTRACT

An FSK signal receiver includes an amplifier which amplifies a first FSK signal at an adjustable gain. A frequency converter converts an output signal from the amplifier into a second FSK signal having a frequency lower than a frequency of the first FSK signal. A demodulator demodulates the second FSK signal into a baseband signal. A bit-state detector detects a bit state from the baseband signal in response to a threshold. A calculator calculates a number of times of occurrence of a fact that the baseband signal moves across the threshold during a given time. The gain of the amplifier is adjusted in response to the number of times which is calculated by the calculator.

1 Claim, 28 Drawing Sheets

TIME

FIG. 38

ERROR

2606··· 0 0 0 0 1 0 0 1 0 0 0 0 0 1 0 0 0 1 0 0 0 1 0 0 0 1 0 0 0 0 ···

2605··· 1 1 1 0 0 0 1 0 1 0 1 1 1 0 0 0 0 1 0 0 1 0 0 1 0 0 0 1 1 1 ···

BEFORE CORRECTION        X 0 1 X        1 X    0 X    1 X    0 X

FIG. 39

| FSK INSTANTANEOUS FREQUENCY | CORRESPONDING BITS | ERROR NUMBER | FREQUENCY | BER |
|---|---|---|---|---|
| $f_0 + f_2$ | 10 | 3 | 110 | 0.027 |
| $f_0 + f_1$ | 11 | 0 | 105 | 0.000 |
| $f_0 - f_1$ | 01 | 1 | 98 | 0.010 |
| $f_0 - f_2$ | 00 | 2 | 108 | 0.019 |

FIG. 40

MSB··· (1)(1) X 1 1 1 1 0 0 0 1 0 0 0 1 ···
LSB··· (1)(0) 0 X 0 1 X 0 X 0 X 1 X 1 1 ···

FSK SIGNAL RECEIVER

This application is a division of application Ser. No. 08/548,373 filed Nov. 1, 1995, now U.S. Pat. No. 5,781,588.

BACKGROUND OF THE INVENTION

1. Field of the Invention

This invention relates to an FSK (frequency shift keyed) signal receiver.

2. Description of the Prior Art

Japanese published unexamined patent application 61-141228 discloses an FM demodulator having an automatic gain controller and an automatic frequency controller.

There is a known FSK (frequency shift keyed) signal receiver having an automatic gain controller and an automatic frequency controller. As will be described later, the gain controller and the frequency controller in the known FSK signal receiver have problems.

SUMMARY OF THE INVENTION

It is an object of this invention to provide an improved FSK (frequency shift keyed) signal receiver.

A first aspect of this invention provides an FSK signal receiver comprising an amplifier amplifying a first FSK signal at an adjustable gain; a frequency converter converting an output signal from the amplifier into a second FSK signal having a frequency lower than a frequency of the first FSK signal; a demodulator demodulating the second FSK signal into a baseband signal; a bit-state detector detecting a bit state from the baseband signal in response to a threshold, and outputting recovered data corresponding to the detected bit state; a calculator calculating a number of times of occurrence of a fact that the baseband signal moves across the threshold during a given time; and AGC means for adjusting the gain of the amplifier in response to the number of times which is calculated by the calculator.

A second aspect of this invention Is based on the first aspect thereof, and provides an FSK signal receiver wherein the AGC means comprises means for increasing the gain of the amplifier as the number of times which is calculated by the calculator increases.

A third aspect of this invention is based on the first aspect thereof, and provides an FSK signal receiver wherein the AGC means comprises means for comparing the number of times which is calculated by the calculator with a predetermined reference number, means for increasing the gain of the amplifier when the number of times which is calculated by the calculator exceeds the reference number, and means for decreasing the gain of the amplifier when the number of times which is calculated by the calculator does not exceed the reference number.

A fourth aspect of this invention is based on the first aspect thereof, and provides an FSK signal receiver wherein the AGC means comprises means for comparing the number of times which is calculated by the calculator with plural different reference numbers, and means for adjusting the gain of the amplifier in a stepwise manner in response to a result of the comparison.

A fifth aspect of this invention is based on the first aspect thereof, and provides an FSK signal receiver wherein the frequency converter comprises means for generating first and second local oscillator signals having a quadrature relation with each other; a first mixer mixing the output signal of the amplifier and the first local oscillator signal; a second mixer mixing the output signal of the amplifier and the second local oscillator signal; a first low pass filter processing an output signal of the first mixer; a second low pass filter processing an output signal of the second mixer; a first amplitude limiter making an output signal of the first low pass filter into a digital baseband in-phase signal; a second amplitude limiter making an output signal of the second low pass filter into a digital baseband quadrature-phase signal; and means for feeding the digital baseband in-phase signal and the digital baseband quadrature-phase signal to the demodulator; and wherein the demodulator comprises a quadrature demodulating section executing quadrature demodulation responsive to the digital baseband in-phase signal and the digital baseband quadrature-phase signal; and a low pass filter processing an output signal of the quadrature demodulating section.

A sixth aspect of this invention provides an FSK signal receiver comprising an amplifier amplifying a first FSK signal at an adjustable gain; means for generating first and second local oscillator signals having a quadrature relation with each other; a first mixer mixing the output signal of the amplifier and the first local oscillator signal; a second mixer mixing the output signal of the amplifier and the second local oscillator signal; a first low pass filter processing an output signal of the first mixer; a second low pass filter processing an output signal of the second mixer; a first amplitude limiter making an output signal of the first low pass filter into a digital baseband in-phase signal; a second amplitude limiter making an output signal of the second low pass filter into a digital baseband quadrature-phase signal; a quadrature demodulating section executing quadrature demodulation responsive to the digital baseband in-phase signal and the digital baseband quadrature-phase signal; a low pass filter processing an output signal of the quadrature demodulating section; a bit-state detector detecting a bit state from the baseband signal in response to a threshold; a calculator calculating a number of times of occurrence of a fact that the output signal of the quadrature demodulating section changes in state; and AGC means for adjusting the gain of the amplifier in response to the number of times which is calculated by the calculator.

A seventh aspect of this invention is based on the first aspect thereof, and provides an FSK signal receiver further comprising means for correcting errors in the recovered data; means for calculating a number of errors corrected by the correcting means; and means for suspending operation of the AGC means when the number of errors which is calculated by the calculating means is smaller than a given number.

An eighth aspect of this invention is based on the first aspect thereof, and provides an FSK signal receiver wherein the bit-state detector and the calculator comprise a combination of an A/D converter, a CPU, and a D/A converter.

A ninth aspect of this invention is based on the first aspect thereof, and provides an FSK signal receiver wherein the bit-state detector and the calculator comprise a combination of an A/D converter and a CPU.

A tenth aspect of this invention is based on the seventh aspect thereof, and provides an FSK signal receiver wherein the bit-state detector, the calculator, the correcting means, the calculating means, and the suspending means comprise a combination of an A/D converter, a CPU, and a D/A converter.

An eleventh aspect of this invention is based on the seventh aspect thereof, and provides an FSK signal receiver wherein the bit-state detector, the calculator, the correcting means, the calculating means, and the suspending means comprise a combination of an A/D converter and a CPU.

A twelfth aspect of this invention provides an FSK signal receiver comprising a local oscillator outputting a local oscillator signal having an adjustable frequency; a frequency converter converting a first FSK signal into a second FSK signal in response to the local oscillator signal, the second FSK signal having a frequency lower than a frequency of the first FSK signal; a demodulator demodulating the second FSK signal into a baseband signal; a bit-state detector detecting a bit state from the baseband signal in response to a threshold, and outputting recovered data corresponding to the detected bit state; an error correction circuit correcting errors in the recovered data; a calculator calculating a ratio between a mark bit error rate and a space bit error rate, the mark bit error rate relating to errors of mark bits in the recovered data which are corrected by the error correction circuit, the space bit error rate relating to errors of space bits in the recovered data which are corrected by the error correction circuit; and AFC means for adjusting the frequency of the local oscillator signal in response to the ratio calculated by the calculator.

A thirteenth aspect of this invention is based on the twelfth aspect thereof, and provides an FSK signal receiver further comprising means for detecting whether or not output data from the error correction circuit is one-sided with respect to one of mark and space, and means for suspending operation of the AFC means when the output data from the error correction circuit is one-sided with respect to one of mark and space.

A fourteenth aspect of this invention is based on the twelfth aspect thereof, and provides an FSK signal receiver wherein the frequency converter comprises means for generating first and second local oscillator signals having a quadrature relation with each other; a first mixer mixing the output signal of the amplifier and the first local oscillator signal; a second mixer mixing the output signal of the amplifier and the second local oscillator signal; a first low pass filter processing an output signal of the first mixer; a second low pass filter processing an output signal of the second mixer; a first amplitude limiter making an output signal of the first low pass filter into a digital baseband in-phase signal; a second amplitude limiter making an output signal of the second low pass filter into a digital baseband quadrature-phase signal; and means for feeding the digital baseband in-phase signal and the digital baseband quadrature-phase signal to the demodulator; and wherein the demodulator comprises: a quadrature demodulating section executing quadrature demodulation responsive to the digital baseband in-phase signal and the digital baseband quadrature-phase signal; and a low pass filter processing an output signal of the quadrature demodulating section.

A fifteenth aspect of this invention is based on the twelfth aspect thereof, and provides an FSK signal receiver wherein the bit-state detector, the error correction circuit, and the calculator comprise a combination of an A/D converter, a CPU, and a D/A converter.

A sixteenth aspect of this invention is based on the twelfth aspect thereof, and provides an FSK signal receiver wherein the bit-state detector, the error correction circuit, and the calculator comprise a combination of an A/D converter and a CPU.

A seventeenth aspect of this invention is based on the twelfth aspect thereof, and provides an FSK signal receiver further comprising means for activating the calculator during every period for which the first FSK signal contains data alternating between mark and space.

An eighteenth aspect of this invention is based on the seventeenth aspect thereof, and provides an FSK signal receiver wherein the bit-state detector, the error correction circuit, the calculator, and the activating means comprise a combination of an A/D converter, a CPU, and a D/A converter.

A nineteenth aspect of this invention is based on the seventeenth aspect thereof, and provides an FSK signal receiver wherein the bit-state detector, the error correction circuit, the calculator, and the activating means comprise a combination of an A/D converter and a CPU.

A twentieth aspect of this invention provides an FSK signal receiver comprising an amplifier amplifying an FSK signal at an adjustable gain; means for generating first and second local oscillator signals having a quadrature relation with each other; a first mixer mixing the output signal of the amplifier and the first local oscillator signal; a second mixer mixing the output signal of the amplifier and the second local oscillator signal; a first low pass filter processing an output signal of the first mixer into a baseband in-phase signal; a second low pass filter processing an output signal of the second mixer into a baseband quadrature-phase signal; a third mixer mixing the baseband in-phase signal and the baseband quadrature-phase signal; a quadrature demodulator recovering data from the baseband in-phase signal and the baseband quadrature-phase signal; an amplitude detector detecting an amplitude of an output signal of the third mixer; and AGC means for adjusting the gain of the amplifier in response to the amplitude detected by the amplitude detector.

A twenty-first aspect of this invention provides an FSK signal receiver comprising an amplifier amplifying an FSK signal at an adjustable gain; means for generating first and second local oscillator signals having a quadrature relation with each other; a first mixer mixing the output signal of the amplifier and the first local oscillator signal; a second mixer mixing the output signal of the amplifier and the second local oscillator signal; a first low pass filter processing an output signal of the first mixer into a baseband in-phase signal; a second low pass filter processing an output signal of the second mixer into a baseband quadrature-phase signal; a quadrature demodulator recovering data from the baseband in-phase signal and the baseband quadrature-phase signal; means for generating third and fourth local oscillator signals having a quadrature relation with each other; a third mixer mixing the output signal of the first low pass filter and the third local oscillator signal; a fourth mixer mixing the output signal of the second low pass filter and the fourth local oscillator signal; a subtracter receiving output signals of the third and fourth mixers and outputting a signal representing a difference between the output signals of the third and fourth mixers; an amplitude detector detecting an amplitude of the output signal of the subtracter; and AGC means for adjusting the gain of the amplifier in response to the amplitude detected by the amplitude detector.

A twenty-second aspect of this invention provides an FSK signal receiver comprising an amplifier amplifying an FSK signal at an adjustable gain; means for generating first and second local oscillator signals having a quadrature relation with each other; a first mixer mixing the output signal of the amplifier and the first local oscillator signal; a second mixer mixing the output signal of the amplifier and the second local oscillator signal; a first low pass filter processing an output signal of the first mixer into a baseband in-phase signal; a second low pass filter processing an output signal of the second mixer into a baseband quadrature-phase signal; means for generating third and fourth local oscillator signals having a quadrature relation with each other; a third mixer mixing the output signal of the first low pass filter and the third local oscillator signal; a fourth mixer mixing the output signal of the second low pass filter and the fourth local oscillator signal; a subtracter receiving output signals of the third and fourth mixers and outputting a signal representing a difference between the output signals of the third and fourth mixers; a frequency-to-voltage converter recovering data from the output signal of the subtracter; an amplitude detector detecting an amplitude of the output signal of the subtracter; and AGC means for adjusting the gain of the amplifier in response to the amplitude detected by the amplitude detector.

A twenty-third aspect of this invention is based on the twenty-second aspect thereof, and provides an FSK signal receiver wherein the frequency-to-voltage converter comprises an amplitude limiter processing the output signal of the subtracter; an edge detector detecting an edge in an output signal of the amplitude limiter; a pulse generator converting an output signal of the edge detector into a pulse having a given width; and a low pass filter processing an output signal of the pulse generator into the recovered data.

A twenty-fourth aspect of this invention is based on the twentieth aspect thereof, and provides an FSK signal receiver wherein the quadrature demodulator comprises a D-type flip-flop.

A twenty-fifth aspect of this invention is based on the twenty-third aspect thereof, and provides an FSK signal receiver wherein the edge detector comprises an Exclusive-OR circuit having first and second input terminals, the first input terminal being subjected to the output signal of the amplitude limiter; a combination of a resistor and a capacitor connected to the second input terminal of the Exclusive-OR circuit and forming a delay circuit; and means for feeding the output signal of the amplitude limiter to the second input terminal of the Exclusive-OR circuit via the delay circuit.

A twenty-sixth aspect of this invention is based on the twenty-third aspect thereof, and provides an FSK signal receiver wherein the edge detector comprises an Exclusive-OR circuit having first and second input terminals, the first input terminal being subjected to the output signal of the amplitude limiter; a series combination of invertors connected to the second input terminal of the Exclusive-OR circuit and forming a delay circuit; and means for feeding the output signal of the amplitude limiter to the second input terminal of the Exclusive-OR circuit via the delay circuit.

A twenty-seventh aspect of this invention provides a time diversity receiver comprising a demodulator demodulating an input signal into a baseband signal; a counter periodically sampling the baseband signal at a given sampling rate greater than a bit rate of the input signal, and calculating a number of samples of the baseband signal in a given state for every bit; a processor adding sample numbers calculated by the counter for every corresponding bits in previously received block data and currently received block data retransmitted according to time diversity: a memory for storing a result of the adding by the processor for every bit in block data; and a bit-state detector recovering bi-value data from the result of the adding by the processor.

A twenty-eighth aspect of this invention is based on the twenty-seventh aspect thereof, and provides a time diversity receiver further comprising a weighting circuit weighting the sample numbers calculated by the counter and informing the processor of the weighting-resultant sample numbers.

A twenty-ninth aspect of this invention is based on the twenty-seventh aspect thereof, and provides a time diversity receiver wherein the counter comprises a sample-and-hold device periodically sampling and holding the baseband signal in response to a sampling clock signal having a frequency higher than a frequency corresponding to the bit rate of the input signal; a comparator comparing a voltage of an output signal of the sample-and-hold device with a predetermined reference voltage; an AND circuit gating an output signal of the comparator in response to the sampling clock signal; a counting section counting pulses in an output signal of the AND circuit and being periodically reset by a bit sync signal; and a latch latching an output signal of the counting section in response to the bit sync signal.

A thirtieth aspect of this invention is based on the twenty-seventh aspect thereof, and provides a time diversity receiver wherein the counter comprises means for suspending the calculation of the sample number during a period corresponding to an edge of every 1-bit interval.

A thirty-first aspect of this invention is based on the twenty-seventh aspect thereof, and provides a time diversity receiver wherein the counter comprises a first AND circuit executing AND operation between a count mask signal and a sampling clock signal having a frequency higher than a frequency corresponding to the bit rate of the input signal; a sample-and-hold device periodically sampling and holding the baseband signal in response to an output signal of the first AND circuit; a comparator comparing a voltage of an output signal of the sample-and-hold device with a predetermined reference voltage; a second AND circuit gating an output signal of the comparator in response to the output signal of the first AND circuit; a counting section counting pulses in an output signal of the second AND circuit and being periodically reset by a bit sync signal; and a latch latching an output signal of the counting section in response to the bit sync signal.

A thirty-second aspect of this invention provides a time diversity receiver comprising an amplifier amplifying an input signal at an adjustable gain; a demodulator demodulating an output signal of the amplifier into a baseband signal; a first counter periodically sampling the baseband signal at a given sampling rate greater than a bit rate of the input signal, and detecting samples of the baseband signal in a given state in response to a first reference level and calculating a number of the samples in the given state for every bit; a processor adding sample numbers calculated by the first counter for every corresponding bits in previously received block data and currently received block data retransmitted according to time diversity; a memory for storing a result of the adding by the processor for every bit in block data; a bit-state detector recovering bi-value data from the result of the adding by the processor; a second counter periodically sampling the baseband signal at the given sampling rate, and detecting samples of the baseband signal in the given state in response to a second reference level different from the first reference level and calculating a number of the samples in the given state for every bit; and AGC means for adjusting the gain of the amplifier in response to both the sample number calculated by the first counter and the sample number calculated by the second counter.

A thirty-third aspect of this invention is based on the twenty-seventh aspect thereof, and provides a time diversity receiver wherein the demodulator comprises means for generating first and second local oscillator signals having a quadrature relation with each other; a first mixer mixing the input signal and the first local oscillator signal; a second mixer mixing the input signal and the second local oscillator signal; a first low pass filter processing an output signal of the first mixer; a second low pass filter processing an output signal of the second mixer; a first amplitude limiter making an output signal of the first low pass filter into a digital baseband in-phase signal; a second amplitude limiter making an output signal of the second low pass filter into a digital baseband quadrature-phase signal; and a quadrature demodulating section recovering the baseband signal from the digital baseband in-phase signal and the digital baseband quadrature-phase signal.

A thirty-fourth aspect of this invention is based on the thirty-third aspect thereof, and provides a time diversity receiver further comprising a frequency error detector adding sample numbers calculated by the counter for every corresponding bits in previously received block data and currently received block data retransmitted according to time diversity during every period for which the input signal contains data alternating between two different states, and calculating a difference between a result of said adding and a given reference value and outputting a frequency error signal depending on the calculated difference; and means for varying a bit-state detection level used in the bit-state detector in response to the frequency error signal.

A thirty-fifth aspect of this invention is based on the thirty-third aspect thereof, and provides a time diversity receiver further comprising a second memory temporarily storing the sample number calculated by the counter; a state change detector comparing the sample number stored in the second memory and a new sample number calculated by the counter to detect a data state change; a frequency error detector adding sample numbers calculated by the counter only when the state change detector detects a data state change, and calculating a difference between a result of said adding and a given reference value and outputting a frequency error signal depending on the calculated difference after reception of every given-bit-length data; and means for varying a bit-state detection level used in the bit-state detector in response to the frequency error signal.

A thirty-sixth aspect of this invention is based on the thirty-third aspect thereof, and provides a time diversity receiver further comprising a second memory temporarily storing the sample number calculated by the counter; a state change detector comparing the sample number stored in the second memory and a new sample number calculated by the counter to detect a data state change; a frequency error detector adding sample numbers in a given range and calculated by the counter only when the state change detector detects a data state change, and calculating a difference between a result of said adding and a given reference value and outputting a frequency error signal depending on the calculated difference after reception of every given-bit-length data; and means for varying a bit-state detection level used in the bit-state detector in response to the frequency error signal.

A thirty-seventh aspect of this invention is based on the thirty-third aspect thereof, and provides a time diversity receiver further comprising a frequency error detector adding sample numbers calculated by the counter during every period for which the input signal contains data alternating between two different states, and calculating a difference between a result of said adding and a given reference value and outputting a frequency error signal depending on the calculated difference; and AFC means for varying a frequency of the first and second local oscillator signals in response to the frequency error signal.

A thirty-eighth aspect of this invention is based on the thirty-third aspect thereof, and provides a time diversity receiver further comprising a second memory temporarily storing the sample number calculated by the counter; a state change detector comparing the sample number stored in the second memory and a new sample number calculated by the counter to detect a data state change; a frequency error detector adding sample numbers calculated by the counter only when the state change detector detects a data state change, and calculating a difference between a result of said adding and a given reference value and outputting a frequency error signal depending on the calculated difference after reception of every given-bit-length data; and AFC means for varying a frequency of the first and second local oscillator signals in response to the frequency error signal.

A thirty-ninth aspect of this invention is based on the thirty-third aspect thereof, and provides a time diversity receiver further comprising a second memory temporarily storing the sample number calculated by the counter; a state change detector comparing the sample number stored in the second memory and a new sample number calculated by the counter to detect a data state change; a frequency error detector adding sample numbers in a given range and calculated by the counter only when the state change detector detects a data state change, and calculating a difference between a result of said adding and a given reference value and outputting a frequency error signal depending on the calculated difference after reception of every given-bit-length data; and AFC means for varying a frequency of the first and second local oscillator signals in response to the frequency error signal.

A fortieth aspect of this invention provides an FSK signal receiver comprising a demodulator demodulating a multi-value FSK signal into a voltage signal in response to transmission rate information, the voltage signal having a voltage depending on an instantaneous frequency of the multi-value FSK signal; a bit-state detector detecting a bit state from the voltage signal in response to a threshold voltage, and outputting recovered data corresponding to the detected bit state; means for extracting the transmission rate information from the recovered data, and feeding the transmission rate information to the demodulator; and means for adjusting the threshold voltage used in the bit-state detector in response to the transmission rate information extracted by the extracting means.

A forty-first aspect of this invention is based on the fortieth aspect thereof, and provides an FSK signal receiver further comprising means connected between the demodulator and the bit-state detector for removing an error between a bias voltage and a central voltage of the voltage signal.

A forty-second aspect of this invention is based on the fortieth aspect thereof, and provides an FSK signal receiver wherein the bit-state detector comprises a first comparator comparing the voltage signal with a bias voltage corresponding to a central voltage of the voltage signal; an absolute value circuit converting the voltage signal into an absolute value signal representing an absolute value of the voltage of the voltage signal with respect to a reference corresponding to the bias voltage; a second comparator comparing the absolute value signal and the threshold voltage; a bit sync circuit generating a bit sync signal in response to output signals of the first and second comparators; a latch latching the output signals of the first and second comparators at a timing responsive to the bit sync signal; and means for feeding an output signal of the latch to the extracting means as the recovered data.

A forty-third aspect of this invention provides an FSK signal receiver comprising a demodulator demodulating a multi-value FSK signal into a voltage signal in response to transmission rate information, the voltage signal having a voltage depending on an instantaneous frequency of the multi-value FSK signal; an A/D converter converting the voltage signal into a corresponding digital signal, and outputting the digital signal; a bit sync device generating a bit sync signal from the output signal of the A/D converter; a bit-state detector detecting a bit state from the output signal of the A/D converter in response to a threshold value at a timing responsive to the bit sync signal, and outputting recovered data corresponding to the detected bit state; an error correction device correcting errors in the recovered data; a histogram calculator providing histograms of digital values of the output signal of the A/D converter which occurs at every moment of the bit-state detection by the bit-state detector for respective different symbol states in response to output data from the error correction device; means for extracting the transmission rate information from the output data of the error correction device, and feeding the transmission rate information to the demodulator; and means for adjusting the threshold voltage used in the bit-state detector in response to the histograms provided by the histogram calculator and also the transmission rate information extracted by the extracting means.

A forty-fourth aspect of this invention provides an FSK signal receiver comprising a demodulator demodulating a multi-value FSK signal into a voltage signal in response to transmission rate information, the voltage signal having a voltage depending on an instantaneous frequency of the multi-value FSK signal; a bit-state detector detecting a bit state from the voltage signal in response to a threshold value, and outputting recovered data corresponding to the detected bit state; an error correction device correcting errors in the recovered data; a calculator connected to the error correction device and calculating bit error rates for respective symbol states; means for extracting the transmission rate information from the recovered data, and feeding the transmission rate information to the demodulator; and means for adjusting the threshold voltage used in the bit-state detector in response to the transmission rate information extracted by the extracting means and also a variation among the bit error rates calculated by the calculator.

A forty-fifth aspect of this invention is based on the forty-fourth aspect thereof, and provides an FSK signal receiver further comprising means for suspending the adjustment of the threshold voltage in response to the variation among the bit error rates under given conditions of errors.

A forty-sixth aspect of this invention is based on the fortieth aspect thereof, and provides an FSK signal receiver further comprising means for generating the threshold voltage on the basis of a reference voltage.

A forty-seventh aspect of this invention is based on the forty-sixth aspect thereof, and provides an FSK signal receiver wherein the adjusting means comprises means for generating different primary threshold voltages on the basis of the reference voltage, and means for selecting one of the different primary threshold voltages, as the threshold voltage used in the bit-state detector, in response to the transmission rate information.

A forty-eighth aspect of this invention is based on the forty-sixth aspect thereof, and provides an FSK signal receiver further comprising means for detecting peaks of the voltage signal, means for detecting an average of the detected peaks during an interval longer than a time corresponding to one symbol, and means for generating the reference voltage in response to the detected average.

A forty-ninth aspect of this invention is based on the forty-eighth aspect thereof, and provides an FSK signal receiver wherein the peak detecting means comprises an absolute value circuit converting the voltage signal into an absolute value signal representing an absolute value of the voltage of the voltage signal with respect to a reference corresponding to a bias voltage; a peak hold circuit periodically holding a peak of the absolute value signal in response to a first reset signal; a sample-and-hold circuit periodically sampling and holding an output signal of the peak hold circuit in response to a second reset signal; an integrator integrating an output signal of the sample-and-hold circuit; and a delay circuit delaying the second reset signal and thereby converting the second reset signal into the first reset signal.

A fiftieth aspect of this invention is based on the forty-sixth aspect thereof, and provides an FSK signal receiver wherein the adjusting means comprises a memory storing digital signals corresponding to different threshold values respectively; means for reading out one of the digital signals from the memory in response to the transmission rate information; means for calculating a threshold voltage from the threshold value corresponding to the read-out digital signal with a reference depending on the reference voltage; and a D/A converter generating the threshold voltage used in the bit-state detector in response to the threshold voltage calculated by the calculating means.

A fifty-first aspect of this invention is based on the forty-sixth aspect thereof, and provides an FSK signal receiver wherein the adjusting means comprises a signal level detector detecting a reception level of the multi-value FSK signal; a memory storing digital signals corresponding to different threshold values respectively; means for reading out one of the digital signals from the memory in response to the transmission rate information and the reception level detected by the signal level detector; means for calculating a threshold voltage from the threshold value corresponding to the read-out digital signal with a reference depending on the reference voltage; and a D/A converter generating the threshold voltage used in the bit-state detector in response to the threshold voltage calculated by the calculating means.

BRIEF DESCRIPTION OF THE DRAWINGS

FIG. 38 is a diagram of an example of error-bit positional information and error-free data bits in the FSK signal receiver of FIG. 37.

FIG. 39 is a diagram of an example of the relation among an instantaneous frequency of an RF multi-value FSK signal, corresponding bits, an error number, an appearance frequency, and a calculated BER in connection with the FSK signal receiver of FIG. 37.

FIG. 40 is a diagram of an example of a sequence of higher bits and a sequence of lower bits in recovered data in connection with the FSK signal receiver of FIG. 37.

DESCRIPTION OF THE PREFERRED EMBODIMENTS

A prior-art FSK (frequency shift keyed) signal receiver will be described hereinafter for a better understanding of this invention.

Figure 1:
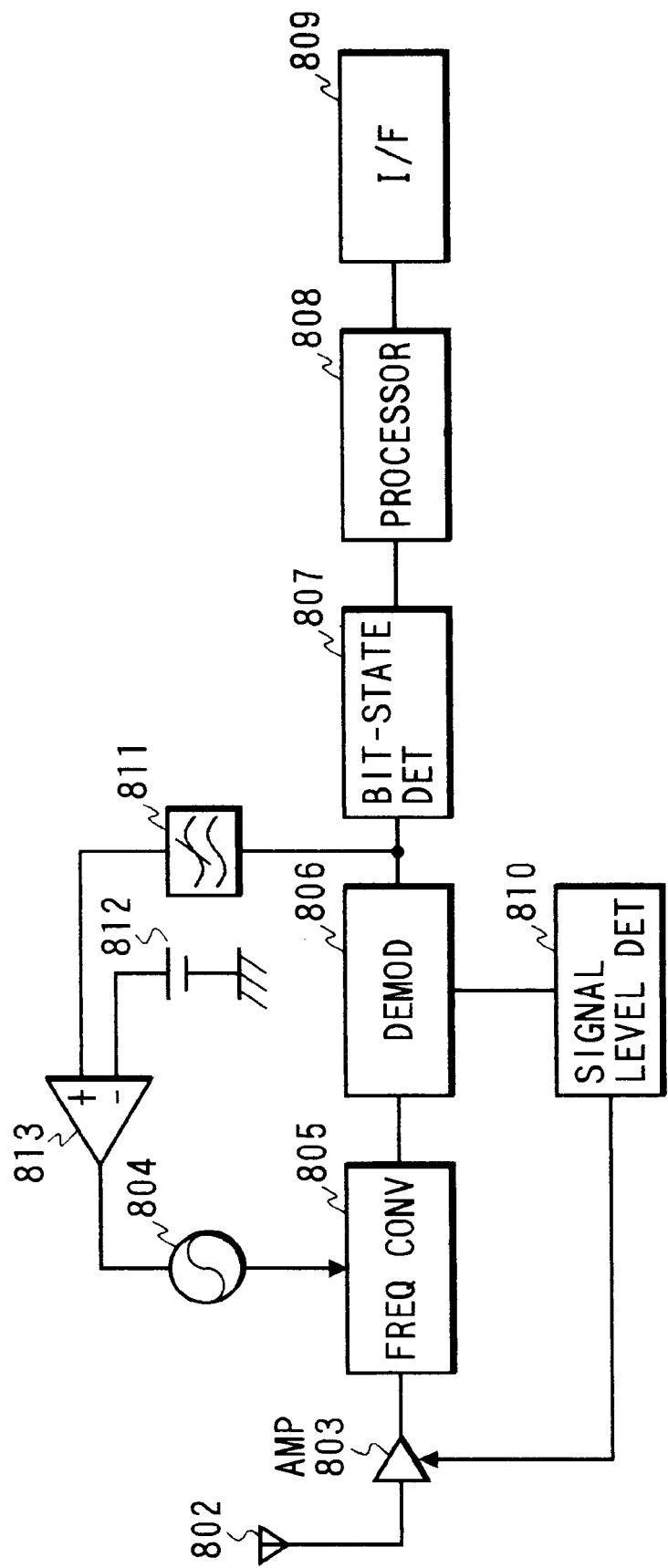
FIG. 1 is a block diagram of a prior-art FSK signal receiver.

With reference to FIG. 1, a prior-art FSK signal receiver includes an antenna 802. An RF (radio frequency) FSK signal caught by the antenna 802 is fed via a variable-gain amplifier 803 to a frequency converter 805. The RF FSK signal is down-converted into an IF (intermediate frequency) FSK signal by the device 805 in response to the RF output signal of a local oscillator 804. A baseband information signal is recovered from the IF FSK signal by a demodulator 806. The recovered baseband information signal is successively processed by a bit-state detector 807 and a data processor 808. The output signal of the data processor 808 is fed to an interface 809 for connection with an external device (not shown) such as a display.

In the prior-art FSK signal receiver of FIG. 1, a signal level detector 810 connected to the demodulator 806 detects the level of the IF FSK signal, that is, the strength of the received RF FSK signal. The signal level detector 810 generates a gain control signal in response to the detected strength of the received RF FSK signal. The gain control signal is fed from the signal level detector 810 to the variable-gain amplifier 803. The gain of the amplifier 803 is adjusted by the gain control signal so that an AGC (automatic gain control) process is implemented.

In the prior-art FSK signal receiver of FIG. 1, the output signal of the demodulator 806 depends on the frequency of the IF FSK signal, that is, the frequency of the received RF FSK signal. The output signal of the demodulator 806 is successively processed by a low pass filter 811 and a differential amplifier 813. The differential amplifier 813 is fed with a predetermined reference voltage from a voltage source 812. The differential amplifier 813 generates a frequency control signal which depends on the frequency of the IF FSK signal. The frequency control signal is fed from the differential amplifier 813 to the local oscillator 804. The local oscillator 804 includes a voltage-controlled oscillator responsive to the frequency control signal. Thus, the frequency of the RF local oscillator signal fed to the frequency converter 805 depends on the frequency of the IF FSK signal, and hence an AFC (automatic frequency control) process is implemented.

The AGC portion and the AFC portion of the prior-art FSK signal receiver of FIG. 1 have problems as follows. In the AGC portion, to detect the strength of the received RF FSK signal, it is necessary to provide the signal level detector 810. In the case where the baseband information signal continues to represent a string of bits of a same logic state during a time longer than a time determined by the time constant of the low pass filter 811, the baseband information signal adversely affects the frequency control signal so that the accuracy of AGC is reduced.

First Embodiment

Figure 2:
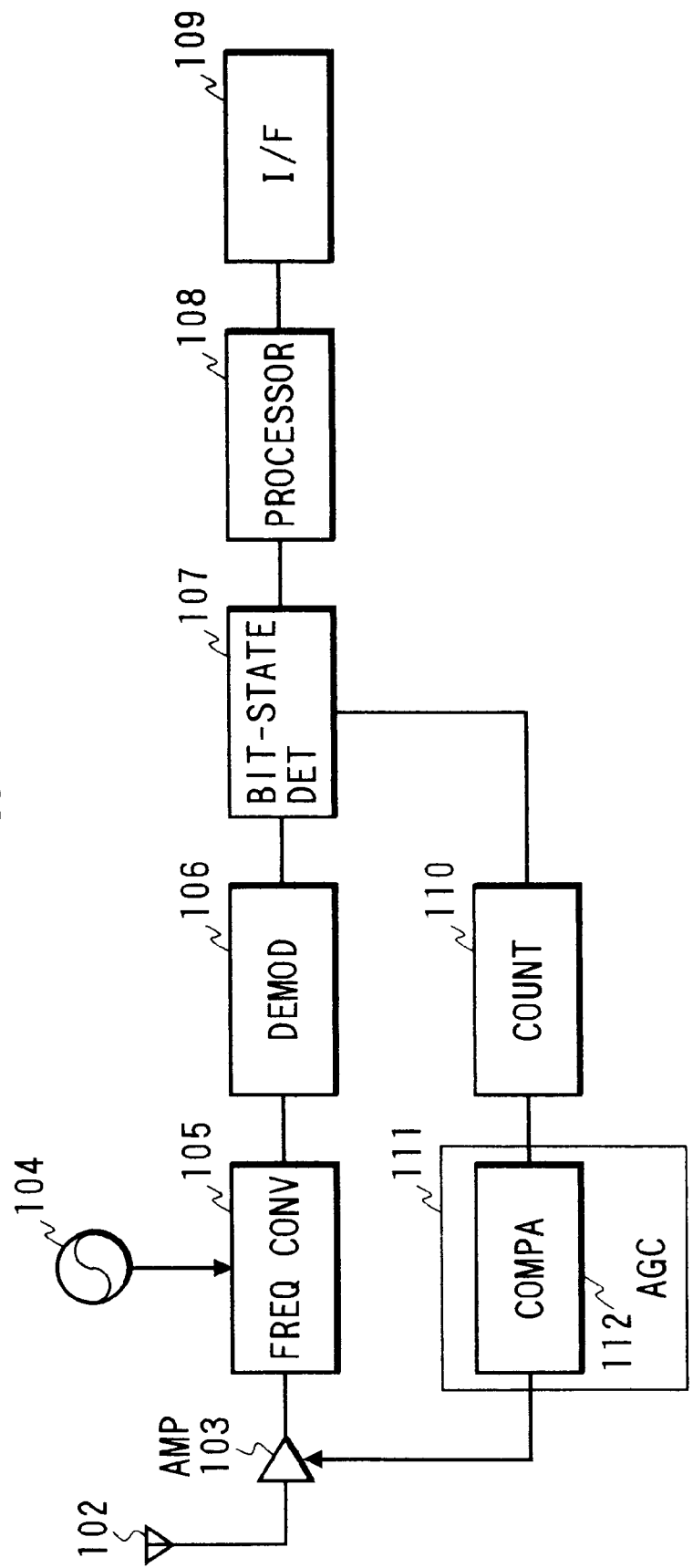
FIG. 2 is a block diagram of an FSK signal receiver according to a first embodiment of this invention.

With reference to FIG. 2, an FSK (frequency shift keyed) signal receiver includes an antenna 102. An RF (radio frequency) FSK signal caught by the antenna 102 is fed via a variable-gain amplifier 103 to a frequency converter 105. The RF FSK signal is down-converted into an IF (intermediate frequency) FSK signal by the device 105 in response to the RF output signal of a local oscillator 104. A baseband information signal is recovered from the IF FSK signal by a demodulator 106. The recovered baseband information signal is successively processed by a bit-state detector 107 and a data processor 108. The output signal of the data processor 108 is fed to an interface 109 for connection with an external device (not shown) such as a display or an electric-to-sound transducer.

The bit-state detector 107 includes a comparator which compares the recovered baseband information signal with a predetermined bit-state-decision threshold voltage or value to detect and decide the logic state of a bit represented by the baseband information signal. Thus, the bit-state detector 107 recovers original data from the baseband information signal. The recovered original data is processed by the data processor 108 before being transmitted to the external device via the interface 109.

A counting device (a counter) 110 receives the output signal of the comparator within the bit-state detector 107. The output signal of the comparator within the bit-state detector 107 changes between a high level and a low level each time the baseband Information signal moves across the threshold value. The counting device 110 includes a counting section which counts level changes in the output signal of the comparator within the bit-state detector 107 during every predetermined interval of time. In other words, the counting section of the counting device 110 detects the number of times of movement of the baseband information signal across the threshold value during every predetermined interval of time. The counting device 110 generates and outputs a signal representing the detected number of times.

An AGC (automatic gain control) device 111 receives the output signal of the counting device 110. Thus, the AGC device 111 is informed of the detected number of times. The AGC device 111 generates a gain control signal in response to the output signal of the counting device 110. The AGC device 111 outputs the gain control signal to the variable-gain amplifier 103 so that the gain of the amplifier 103 is adjusted in response to the gain control signal. Specifically, the AGC device 111 includes a comparator 112 which compares the detected number of times with a predetermined number of times. The comparator 112 within the AGC device 111 generates the gain control signal in response to whether or not the detected number of times exceeds the predetermined number of times. The gain control signal is designed to increase the gain of the amplifier 103 when the detected number of times exceeds the predetermined number of times, and to decrease the gain of the amplifier 103 when the detected number of times is equal to or smaller than the predetermined number of times.

The predetermined interval of time which is used by the counting device 110 is preferably equal to a period T of the transmission of a bit sync signal. In the case where the received RF FSK signal is sufficiently strong relative to internal noise (generated in the receiver stage following the variable-gain amplifier 103), it is usual that each movement of the recovered baseband information signal across the threshold value accurately corresponds to a state change in a string of data bits. Accordingly, in this case, the number of times which is detected by the counting device 110 is relatively small. On the other hand, in the case where the received RF FSK signal is weak, the recovered baseband information signal tends to more frequently across the threshold value due to internal noise. Accordingly, in this case, the number of times which is detected by the counting device 110 tends to be relatively large. Thus, the number of times which is detected by the counting device 110 increases as the strength of the received RF FSK signal decreases. The gain of the amplifier 103 is therefore adjusted in response to the strength of the received RF FSK signal, and automatic gain control (AGC) is implemented.

The FSK signal receiver of FIG. 2 is advantageous over the prior-art FSK signal receiver of FIG. 1 in that the FSK signal receiver of FIG. 2 dispenses with a signal level detector (corresponding to the signal level detector 810 in FIG. 1).

Second Embodiment

Figure 3:
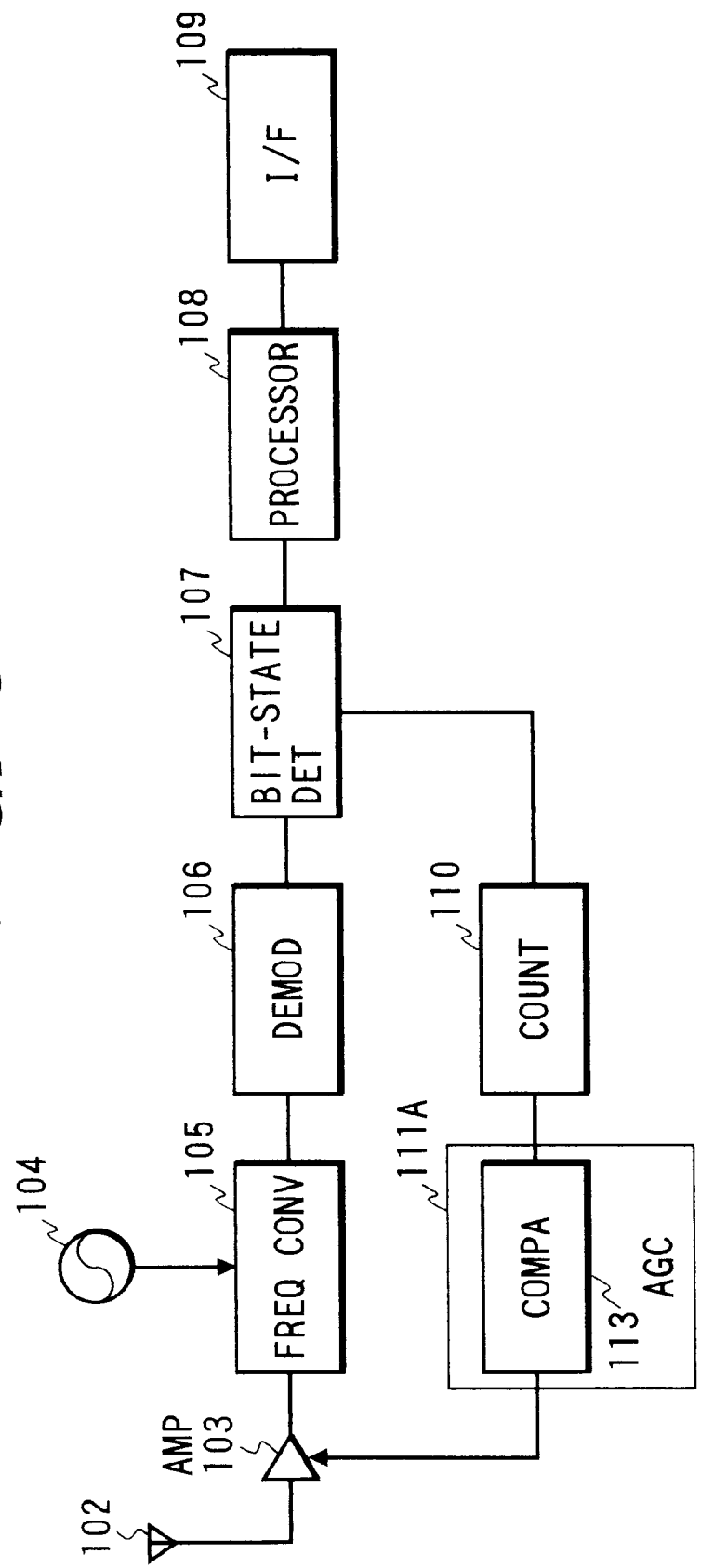
FIG. 3 is a block diagram of an FSK signal receiver according to a second embodiment of this invention.

FIG. 3 shows a second embodiment of this invention which is similar to the embodiment of FIG. 2 except that an AGC device 111A replaces the AGC device 111 of FIG. 2.

In the embodiment of FIG. 3, the AGC device 111A includes a comparator 113 which compares the detected number of times with a plurality of different predetermined numbers of times. The comparator 113 within the AGC device 111A generates a gain control signal in response to the result of the comparison. In this case, the gain control signal enables finer adjustment of the gain of an amplifier 103 in response to the output signal of a counting device 110. The adjustment of the gain of the amplifier 103 by the gain control signal is based on control designing which has multiple steps caused by the plural predetermined numbers of times.

Third Embodiment

Figure 4:
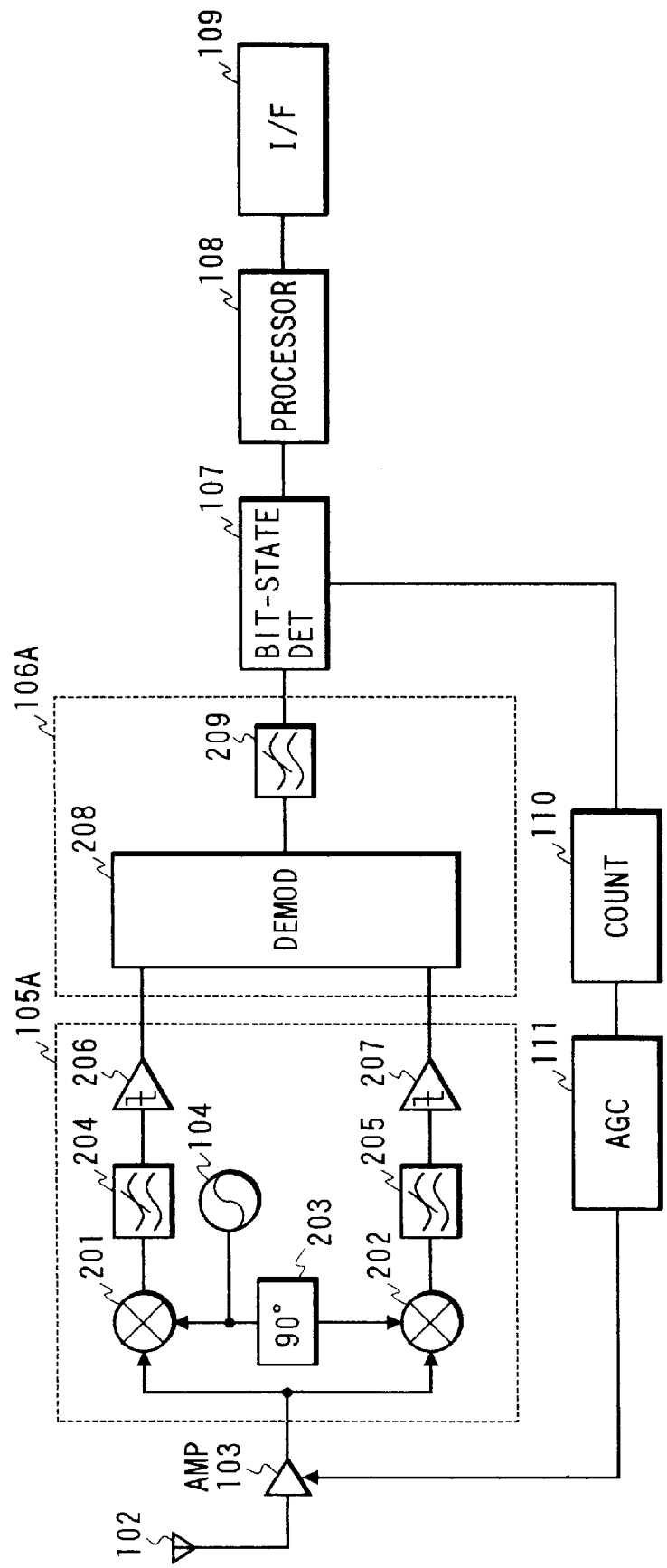
FIG. 4 is a block diagram of an FSK signal receiver according to a third embodiment of this invention.

FIG. 4 shows a third embodiment of this invention which is similar to the embodiment of FIG. 2 except that a frequency converter 105A and a demodulator 106A replaces the frequency converter 105 and the demodulator 106 of FIG. 2.

In the embodiment of FIG. 4, the frequency converter 105A includes mixers 201 and 202, a 90-degree phase shifter 203, low pass filters 204 and 205, and amplitude limiters 206 and 207. An RF (radio frequency) FSK signal caught by an antenna 102 is fed via a variable-gain amplifier 103 to the mixers 201 and 202. A first RF local oscillator signal is fed to the mixer 201 from a local oscillator 104. In addition, the first RF local oscillator signal is fed to the 90-degree phase shifter 203 from the local oscillator 104. The device 203 shifts the phase of the first RF local oscillator signal by 90 degrees, thereby converting the first RF local oscillator signal into a second RF local oscillator signal. The second RF local oscillator signal is fed to the mixer 202 from the 90-degree phase shifter 203. Thus, the first and second RF local oscillator signals fed to the mixers 201 and 202 have a quadrature relation with each other. The frequency of the first and second RF local oscillator signals is set substantially equal to the carrier frequency of a handled RF FSK signal. The device 201 mixes the received RF FSK signal and the first RF local oscillator signal, converting the received RF FSK signal into a signal containing a baseband I (in-phase) signal. The output signal of the mixer 201 is successively processed by the low pass filter 204 and the amplitude limiter 206 so that the baseband I signal is extracted from the output signal of the mixer 201. The resultant baseband I signal outputted from the amplitude limiter 206 has a binary form (a bi-level form). The baseband I signal outputted from the amplitude limiter 206 is fed to the demodulator 106A. On the other hand, the device 202 mixes the received RF FSK signal and the second RF local oscillator signal, converting the received RF FSK signal into a signal containing a baseband Q (quadrature phase) signal. The output signal of the mixer 202 is successively processed by the low pass filter 205 and the amplitude limiter 207 so that the baseband Q signal is extracted from the output signal of the mixer 202. The resultant baseband Q signal outputted from the amplitude limiter 207 has a binary form (a bi-level form). The baseband Q signal outputted from the amplitude limiter 207 is fed to the demodulator 106A.

In the embodiment of FIG. 4, the demodulator 106A includes a quadrature demodulator 208 and a low pass filter 209. The quadrature demodulator 208 receives the baseband I signal and the baseband Q signal from the amplitude limiters 206 and 207 in the frequency converter 105A. The baseband I signal and the baseband Q signal have a quadrature relation with each other. For example, a data bit assumes a high-level state and a low level state when the phase of the baseband Q signal advances and retards from the phase of the baseband I signal respectively. The quadrature demodulator 208 senses the phase relation between the baseband I signal and the baseband Q signal. The quadrature demodulator 208 outputs a high-level voltage and a low-level voltage when the phase of the baseband Q signal advances and retards from the phase of the baseband I signal respectively. The output signal of the quadrature demodulator 208 has a binary form (a bi-level form). The output signal of the quadrature demodulator 208 constitutes a recovered baseband information signal. The recovered baseband information signal is fed via the low pass filter 209 to a bit-state detector 107.

Fourth Embodiment

Figure 5:
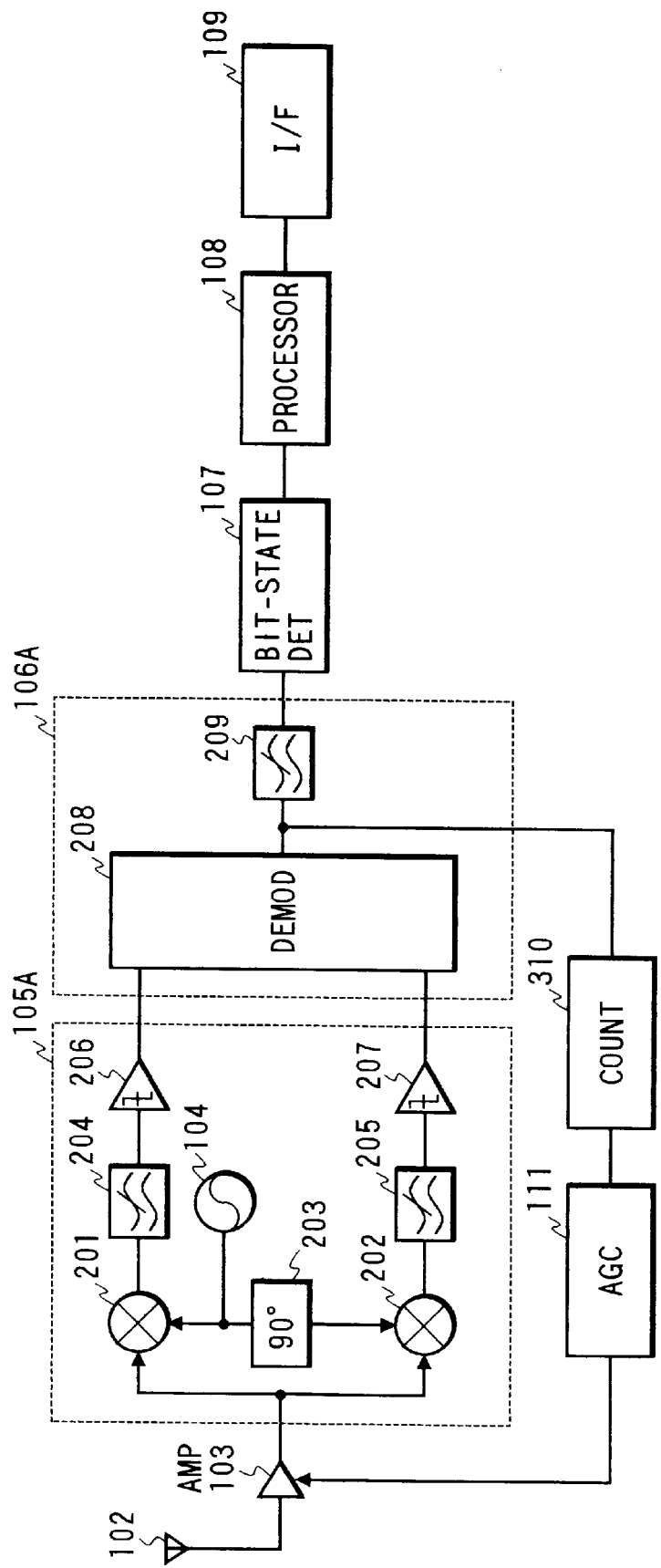
FIG. 5 is a block diagram of an FSK signal receiver according to a fourth embodiment of this invention.

FIG. 5 shows a fourth embodiment of this invention which is similar to the embodiment of FIG. 4 except that a counting device 310 replaces the counting device 110 (see FIGS. 2 and 4).

In the embodiment of FIG. 5, the counting device 310 includes a counter. The counting device 310 receives the binary output signal of a quadrature demodulator 208. The counting device 310 counts state changes (level changes) in the binary output signal of the quadrature demodulator 208 during every predetermined interval of time. In other words, the counting device 310 detects the number of times of a state change in the binary output signal of the quadrature demodulator 208 during every predetermined interval of time. The counting device 310 generates and outputs a signal representing the detected number of times. The counting device 310 is followed by an AGC device 111.

Fifth Embodiment

Figure 6:
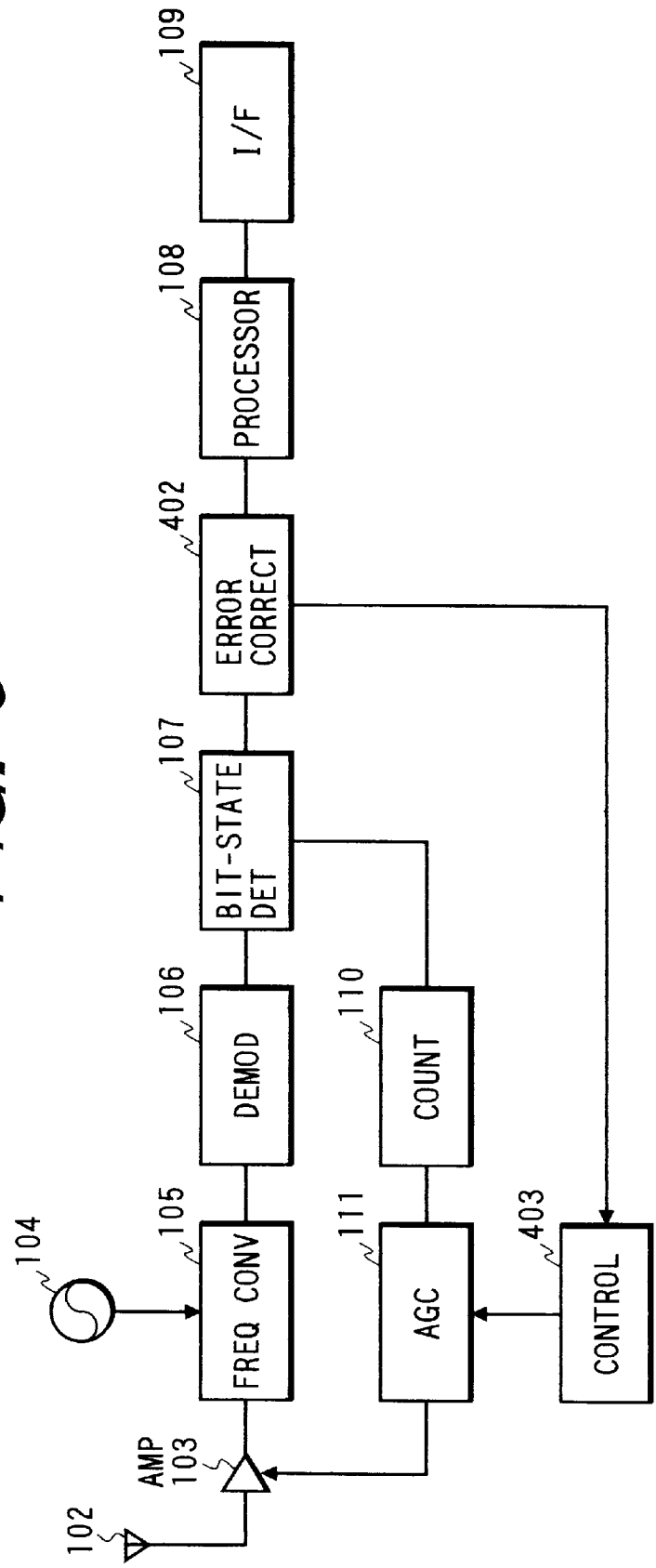
FIG. 6 is a block diagram of an FSK signal receiver according to a fifth embodiment of this invention.

FIG. 6 shows a fifth embodiment of this invention which is similar to the embodiment of FIG. 2 except that an error correction circuit 402 and a controller 403 are additionally provided.

In the embodiment of FIG. 6, the error correction circuit 402 is interposed between a bit-state detector 107 and a data processor 108. The device 402 corrects errors in data recovered by the bit-state detector 107, and outputs error-free data to the data processor 108. Also, the error correction circuit 402 outputs an error-presence signal when a current bit in the recovered data is wrong and is thus corrected.

In the embodiment of FIG. 6. the controller 403 receives the error-presence signal from the error correction circuit 402. The controller 403 includes a counter which counts the number of the occurrence of the error-presence signal during every predetermined interval of time. In other words, the counter in the controller 403 detects the number of bit errors in the recovered data during every predetermined interval of time. The predetermined interval of time which is used by the counter in the controller 403 is equal to a predetermined time interval used by a counting device 110. The controller 403 also includes a comparator which decides whether or not the detected number of bit errors is smaller than a given threshold number. The comparator in the controller 403 generates a control signal in response to the decision regarding the detected number of bit errors. The comparator in the controller 403 outputs the generated control signal to an AGC device 111.

The AGC device 111 is selectively enabled and disabled in response to the control signal fed from the controller 403. When the detected number of bit errors is smaller than the given threshold number, the AGC device 111 is disabled by the control signal so that automatic gain control (AGC) is halted. When the detected number of bit errors is equal to or greater than the given threshold number, the AGC device 111 is enabled by the control signal so that automatic gain control (AGC) is executed.

Sixth Embodiment

Figure 7:
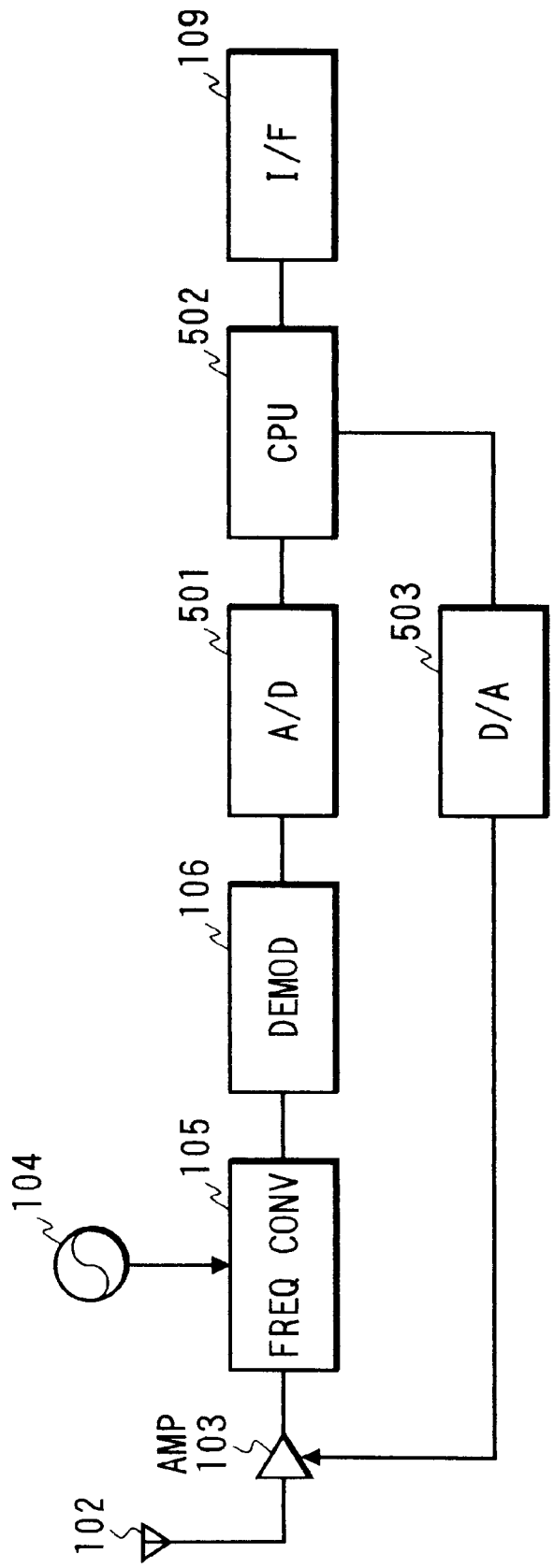
FIG. 7 is a block diagram of an FSK signal receiver according to a sixth embodiment of this invention.

FIG. 7 shows a sixth embodiment of this invention which is similar to the embodiment of FIG. 2 except that an A/D (analog-to-digital) converter 501, a CPU (central processing unit) 502, and a D/A (digital-to-analog) converter 503 replace the bit-state detector 107, the data processor 108, the counting device 110, and the AGC device 111 of FIG. 2.

In the embodiment of FIG. 7, a baseband information signal recovered by a demodulator 106 is periodically sampled by the A/D converter 501 at a frequency higher than a frequency corresponding to the data rate. Every resultant sample of the baseband information signal is changed into a digital version by the A/D converter 501. Thus, the A/D converter 501 generates a digitized baseband information signal. The A/D converter 501 outputs the digitized baseband information signal to the CPU 502. The CPU 502 is programmed to execute processes corresponding to the functions of the bit-state detector 107, the data processor 108, the counting device 110, and the AGC device 111 of FIG. 2. The CPU 502 converts the digitized baseband information signal into a first output signal corresponding to the output signal of the data processor 108. The CPU 502 feeds the first output signal to an interface 109.

The CPU 502 generates a second output signal in response to the digitized baseband information signal. The second output signal corresponds to the output signal of the counting device 110 which represents the number of times of movement of the baseband information signal across the threshold value during every predetermined interval of time. The CPU 502 feeds the second output signal to the D/A converter 503: The device 503 converts the second output signal from the CPU 502 into a corresponding analog signal which constitutes a gain control signal. The D/A converter 503 outputs the gain control signal to a variable-gain amplifier 103.

It should be noted that the CPU 502 may be modified to additionally execute the functions of the error correction circuit 402 and the controller 403 of FIG. 6.

The variable-gain amplifier 103 may be replaced by a type responsive to a digital control signal. In this case, the D/A converter 503 is omitted, and the second output signal from the CPU 502 is directly fed to the variable-gain amplifier.

Seventh Embodiment

Figure 8:
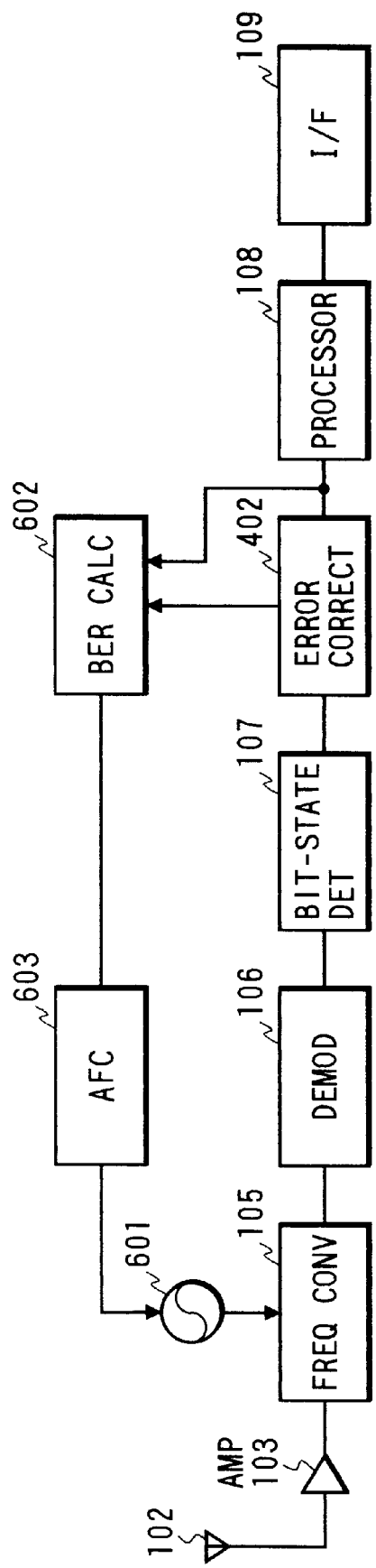
FIG. 8 is a block diagram of an FSK signal receiver according to a seventh embodiment of this invention.

With reference to FIG. 8, an FSK (frequency shift keyed) signal receiver includes an antenna 102. An RF (radio frequency) FSK signal caught by the antenna 102 is fed via a variable-gain amplifier 103 to a frequency converter 105. The RF FSK signal is down-converted into an IF (intermediate frequency) FSK signal by the device 105 in response to the RF output signal of a local oscillator 601. A baseband information signal is recovered from the IF FSK signal by a demodulator 106. The recovered baseband information signal is successively processed by a bit-state detector 107, an error correction circuit 402, and a data processor 108. The output signal of the data processor 108 is fed to an interface 109 for connection with an external device (not shown) such as a display or an electric-to-sound transducer.

The bit-state detector 107 includes a comparator which compares the recovered baseband information signal with a predetermined bit-state-decision threshold voltage or value to detect and decide the logic state of a bit represented by the baseband information signal. Thus, the bit-state detector 107 recovers original data from the baseband information signal. The recovered original data is fed from the bit-state detector 107 to the error correction circuit 402.

The device 402 corrects errors in the recovered original data, and outputs error-free data to the data processor 108. Also, the error correction circuit 402 outputs an error-presence signal when a current bit in the recovered original data is wrong and is thus corrected. The error correction circuit 402 may output an error bit as an error-presence signal. The error-free data is processed by the data processor 108 before being transmitted to the external device via the interface 109.

A calculator 602 receives the error-free data and the error-presence signal from the error correction circuit 402. The calculator 602 includes first and second counters responsive to the error-free data and the error-presence signal. The first counter detects the number of bit errors in "mark" signals during every given interval of time, and thereby calculates the bit error rate (BER) of the mark signals. The second counter detects the number of bit errors in "space" signals during every given interval of time, and thereby calculates the bit error rate (BER) of the space signals. Further, the calculator 602 includes a divider which calculates the ratio between the "mark" BER and the "space" BER. The divider outputs a signal representing the calculated ratio between the "mark" BER and the "space" BER.

An AFC (automatic frequency control) device 603 including a D/A converter receives the output signal of the divider in the calculator 602. The AFC device 603 converts the output signal of the divider into a frequency control signal. Thus, the frequency control signal depends on the ratio between the "mark" BER and the "space" BER. The frequency control signal is fed from the AFC device 603 to the local oscillator 601. The local oscillator 601 includes a voltage-controlled oscillator responsive to the frequency control signal. Thus, the frequency of the RF local oscillator signal fed to the frequency converter 105 is controlled in response to the ratio between the "mark" BER and the "space" BER.

Generally, the ratio between the "mark" BER and the "space" BER varies as a function of the deviation or the difference between the frequency of the RF local oscillator signal fed to the frequency converter 105 and a desired frequency. The control of the frequency of the RF local oscillator signal in response to the ratio between the "mark" BER and the "space" BER is designed so that the frequency of the RF local oscillator signal will be maintained at substantially the desired frequency. In this way, an AFC (automatic frequency control) process is implemented.

Even in the case where the baseband information signal continues to represent a string of bits of a same logic state during a relatively long time, the baseband information signal is prevented from adversely affecting the frequency control signal so that the accuracy of AGC is maintained. In this regard, the embodiment of FIG. 8 is advantageous over the prior-art FSK signal receiver of FIG. 1.

It should be noted that the bit-state detector 107, the error correction circuit 402, the data processor 108, the calculator 602; and the AGC device 603 may be replaced by a combination of an A/D converter, a CPU, and a D/A converter. In this case, the baseband information signal recovered by the demodulator 106 is periodically sampled by the A/D converter at a frequency higher than a frequency corresponding to the data rate. Every resultant sample of the baseband information signal is changed into a digital version by the A/D converter. Thus, the A/D converter generates a digitized baseband information signal. The A/D converter outputs the digitized baseband information signal to the CPU. The CPU is programmed to execute processes corresponding to the functions of the bit-state detector 107, the error correction circuit 402, the data processor 108, the calculator 602, and the AGC device 603. The CPU converts the digitized baseband information signal into a first output signal corresponding to the output signal of the data processor 108. The CPU feeds the first output signal to the interface 109. The CPU generates a second output signal in response to the digitized baseband information signal. The second output signal corresponds to the output signal of the calculator 602 which represents the ratio between the "mark" BER and the "space" BER. The CPU feeds the second output signal to the D/A converter. The D/A converter changes the second output signal from the CPU into a corresponding analog signal which constitutes a frequency control signal. The D/A converter outputs the frequency control signal to the local oscillator 601. The local oscillator 601 may be replaced by a type responsive to a digital control signal. In this case, the D/A converter is omitted, and the second output signal from the CPU is directly fed to the local oscillator.

A controller may be provided which decides whether or not the error-free data outputted from the error correction circuit 402 is considerably one-sided to "mark" or "space". In the case where the error-free data is considerably one-sided, the controller halts major operation of the calculator 602 so that the output signal of the divider in the calculator 602 which occurs immediately before the halt of the major operation of the calculator 602 continues to be fed to the AFC device 603.

Eighth Embodiment

Figure 9:
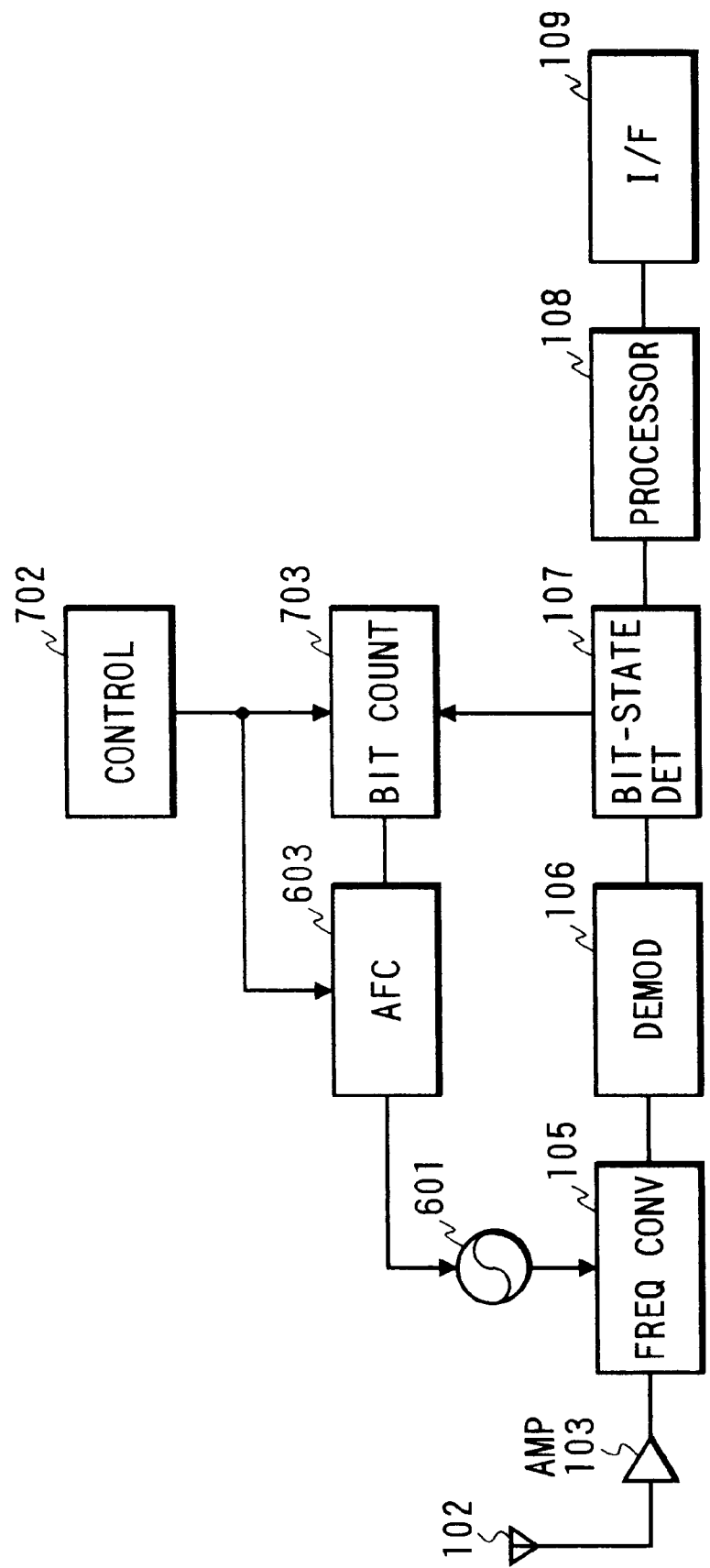
FIG. 9 is a block diagram of an FSK signal receiver according to an eighth embodiment of this invention.

FIG. 9 shows an FSK (frequency shift keyed) signal receiver designed to handle an RF (radio frequency) FSK signal in which an even number of successive reference data segments recurs at a given period. The reference data segments alternate between "mark" and "space".

The FSK signal receiver of FIG. 9 includes an antenna 102. An RF FSK signal caught by the antenna 102 is fed via a variable-gain amplifier 103 to a frequency converter 105. The RF FSK signal is down-converted into an IF (intermediate frequency) FSK signal by the device 105 in response to the RF output signal of a local oscillator 601. A baseband information signal is recovered from the IF FSK signal by a demodulator 106. The recovered baseband information signal is successively processed by a bit-state detector 107 and a data processor 108. The output signal of the data processor 108 is fed to an interface 109 for connection with an external device (not shown) such as a display or an electric-to-sound transducer.

The bit-state detector 107 includes a comparator which compares the recovered baseband information signal with a predetermined bit-state-decision threshold voltage or value to detect and decide the logic state of a bit represented by the baseband information signal. Thus, the bit-state detector 107 recovers original data from the baseband information signal. The recovered original data is fed from the bit-state detector 107 to the data processor 108. The recovered original data is processed by the data processor 108 before being transmitted to the external device via the interface 109.

A controller 702 including a timing signal generator or a clock signal generator outputs a timing signal representing an interval where every set of the reference data segments occurs.

A bit counter 703 receives the recovered data from the bit-state detector 107. In addition, the bit counter 703 receives the timing signal from the controller 702. The bit counter 703 includes first and second counting sections responsive to the recovered data and the timing signal. The first counting section detects the number of "mark" states in the recovered data during every time interval represented by the timing signal. Thus, the first counting section detects the number of "mark" states in the recovered data during a time interval where every set of the reference data segments occurs. The second counting section detects the number of "space" states in the recovered data during every time interval represented by the timing signal. Thus, the second counting section detects the number of "space" states in the recovered data during a time interval where every set of the reference data segments occurs. Further, the bit counter 703 includes a divider which calculates the ratio between the detected "mark" number and the detected "space" number. The divider outputs a signal representing the calculated ratio between the "mark" number and the "space" number.

An AFC (automatic frequency control) device 603 including a D/A converter receives the output signal of the divider in the bit counter 703. The AFC device 603 converts the output signal of the divider into a frequency control signal. Thus, the frequency control signal depends on the ratio between the "mark" number and the "space" number. The frequency control signal is fed from the AFC device 603 to the local oscillator 601. The AFC device 603 also receives the timing signal from the controller 702. The frequency control signal generated by the AFC device 603 is periodically updated in response to the timing signal. The local oscillator 601 includes a voltage-controlled oscillator responsive to the frequency control signal. Thus, the frequency of the RF local oscillator signal fed to the frequency converter 105 is controlled in response to the ratio between the "mark" number and the "space" number.

Generally, the ratio between the "mark" number and the "space" number in the recovered data corresponding to the set of the reference data segments varies as a function of the deviation or the difference between the frequency of the RF local oscillator signal fed to the frequency converter 105 and a desired frequency. The control of the frequency of the RF local oscillator signal in response to the ratio between the "mark" number and the "space" number is designed so that the frequency of the RF local oscillator signal will be maintained at substantially the desired frequency. In this way, an AFC (automatic frequency control) process is implemented.

Even in the case where the baseband information signal continues to represent a string of bits of a same logic state during a relatively long time, the baseband information signal is prevented from adversely affecting the frequency control signal so that the accuracy of AGC is maintained. In this regard, the embodiment of FIG. 9 is advantageous over the prior-art FSK signal receiver of FIG. 1.

It should be noted that the bit-state detector 107, the data processor 108, the controller 702, the bit counter 703, and the AGC device 603 may be replaced by a combination of an A/D converter, a CPU, and a D/A converter. In this case, the baseband information signal recovered by the demodulator 106 is periodically sampled by the A/D converter at a frequency higher than a frequency corresponding to the data rate. Every resultant sample of the baseband information signal is changed into a digital version by the A/D converter. Thus, the A/D converter generates a digitized baseband information signal. The A/D converter outputs the digitized baseband information signal to the CPU. The CPU is programmed to execute processes corresponding to the functions of the bit-state detector 107, the data processor 108, the controller 702, the bit counter 703, and the AGC device 603. The CPU converts the digitized baseband information signal into a first output signal corresponding to the output signal of the data processor 108. The CPU feeds the first output signal to the interface 109. The CPU generates a second output signal in response to the digitized baseband information signal. The second output signal corresponds to the output signal of the bit counter 703 which represents the ratio between the "mark" number and the "space" number. The CPU feeds the second output signal to the D/A converter. The D/A converter changes the second output signal from the CPU into a corresponding analog signal which constitutes a frequency control signal. The D/A converter outputs the frequency control signal to the local oscillator 601. The local oscillator 601 may be replaced by a type responsive to a digital control signal. In this case, the D/A converter is omitted, and the second output signal from the CPU is directly fed to the local oscillator.

Ninth Embodiment

Figure 10:
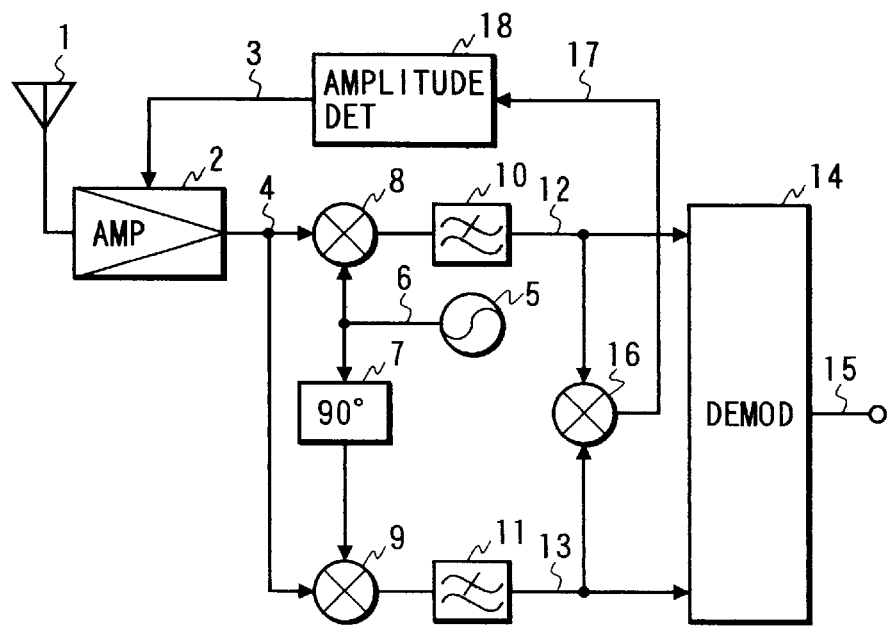
FIG. 10 is a block diagram of an FSK signal receiver according to a ninth embodiment of this invention.

With reference to FIG. 10, an FSK (frequency shift keyed) signal receiver includes an antenna 1. An RF (radio frequency) FSK signal caught by the antenna 1 is fed via a variable-gain amplifier 2 to mixers 8 and 9. In FIG. 4, the RF FSK signal outputted to the mixers 8 and 9 from the variable-gain amplifier 2 is denoted by the reference numeral "4".

A first RF local oscillator signal 6 is fed to the mixer 8 from a local oscillator 5. In addition, the first RF local oscillator signal 6 is fed to a 90-degree phase shifter 7 from the local oscillator 5. The device 7 shifts the phase of the first RF local oscillator signal 6 by 90 degrees, thereby converting the first RF local oscillator signal 6 into a second RF local oscillator signal. The second RF local oscillator signal is fed to the mixer 9 from the 90-degree phase shifter 7. Thus, the first and second RF local oscillator signals fed to the mixers 8 and 9 have a quadrature relation with each other. The frequency of the first and second RF local oscillator signals is set substantially equal to the carrier frequency of a handled RF FSK signal.

The device 8 mixes the received RF FSK signal and the first RF local oscillator signal 6, converting the received RF FSK signal into a signal containing a baseband I (in-phase) signal. The output signal of the mixer 8 is processed by a low pass filter 10 so that the baseband I signal is extracted from the output signal of the mixer 8. The resultant baseband I signal 12 outputted from the low pass filter 10 is fed to a quadrature demodulator 14. On the other hand, the device 9 mixes the received RF FSK signal and the second RF local oscillator signal, converting the received RF FSK signal into a signal containing a baseband Q (quadrature phase) signal. The output signal of the mixer 9 is processed by a low pass filter 11 so that the baseband Q signal is extracted from the output signal of the mixer 9. The resultant baseband Q signal 13 outputted from the low pass filter 11 is fed to the quadrature demodulator 14.

The baseband I signal 12 and the baseband Q signal 13 fed to the quadrature demodulator 14 have a quadrature relation with each other. For example, a data bit assumes a high-level state and a low level state when the phase of the baseband Q signal 13 advances and retards from the phase of the baseband I signal 12 respectively. The quadrature demodulator 14 senses the phase relation between the baseband I signal 12 and the baseband Q signal 13. The quadrature demodulator 14 outputs a high-level voltage and a low-level voltage when the phase of the baseband Q signal 13 advances and retards from the phase of the baseband I signal 12 respectively. The output signal of the quadrature demodulator 14 has a binary form (a bi-level form). The output signal of the quadrature demodulator 14 constitutes a recovered baseband information signal 15. The quadrature demodulator 14 includes, for example, a D-type flip-flip.

A mixer 16 receives the baseband I signal 12 and the baseband Q signal 13 from the low pass filters 10 and 11, mixing and combining the baseband I signal 12 and the baseband Q signal 13 into a composite signal 17. The frequency of the composite signal 17 is substantially equal to twice the frequency of the baseband I signal 12 and the baseband Q signal 13. The amplitude of the composite signal 17 is substantially proportional to the amplitude of the baseband I signal 12 and the baseband Q signal 13. Thus, the amplitude of the composite signal 17 increases and decreases as the strength of the received RF FSK signal rises and drops respectively.

An amplitude detector 18 receives the composite signal 17 from the mixer 16. The device 18 detects the amplitude of the composite signal 17, and generates a gain control signal 3 in response to the detected amplitude. The amplitude detector 18 outputs the gain control signal 3 to the variable-gain amplifier 2 so that the gain of the amplifier 2 is adjusted in response to the gain control signal 3. The gain control signal 3 is designed to increase the gain of the amplifier 2 when the amplitude of the composite signal 17 decreases (that is, when the strength of the received RF FSK signal decreases), and to decrease the gain of the amplifier 2 when the amplitude of the composite signal 17 increases (that is, when the strength of the received RF FSK signal increases). The gain of the amplifier 103 is therefore adjusted in response to the strength of the received RF FSK signal, and hence automatic gain control (AGC) is implemented. One example of the amplitude detector 18 is a full-wave rectifier.

Figure 11:
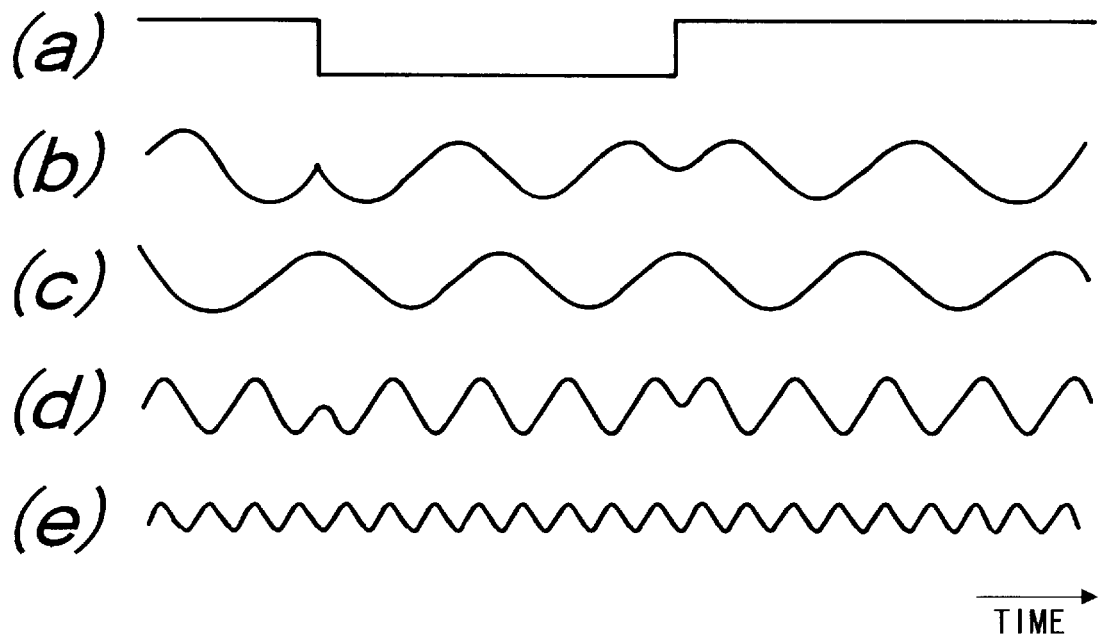
FIG. 11 is a time-domain diagram of various signals in the FSK signal receiver of FIG. 10.

In the case where the state of transmitted data varies as shown in the part (a) of FIG. 11, the levels of the baseband I signal 12 and the baseband Q signal 13 change as shown in the parts (b) and (c) of FIG. 11 respectively. In this case, the composite signal 17 varies as shown in the part (d) of FIG. 11.

Figure 12:
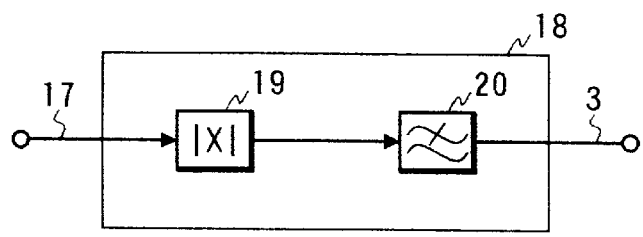
FIG. 12 is a block diagram of an amplitude detector in FIG. 10.

FIG. 12 shows another example of the amplitude detector 18. The amplitude detector 18 of FIG. 12 includes an absolute value circuit (an absolute voltage circuit) 19 and a low pass filter 20. The absolute value circuit 19 receives the composite signal 17 from the mixer 16. The absolute value circuit 19 converts the composite signal 17 into a signal representing the absolute value of the voltage of the composite signal 17. The absolute value circuit 19 outputs the resultant absolute-value signal to the low pass filter 20. The absolute-value signal has a waveform such as shown in the part (e) of FIG. 11. The low pass filter 20 changes the absolute-value signal into the gain control signal 3.

Tenth Embodiment

Figure 13:
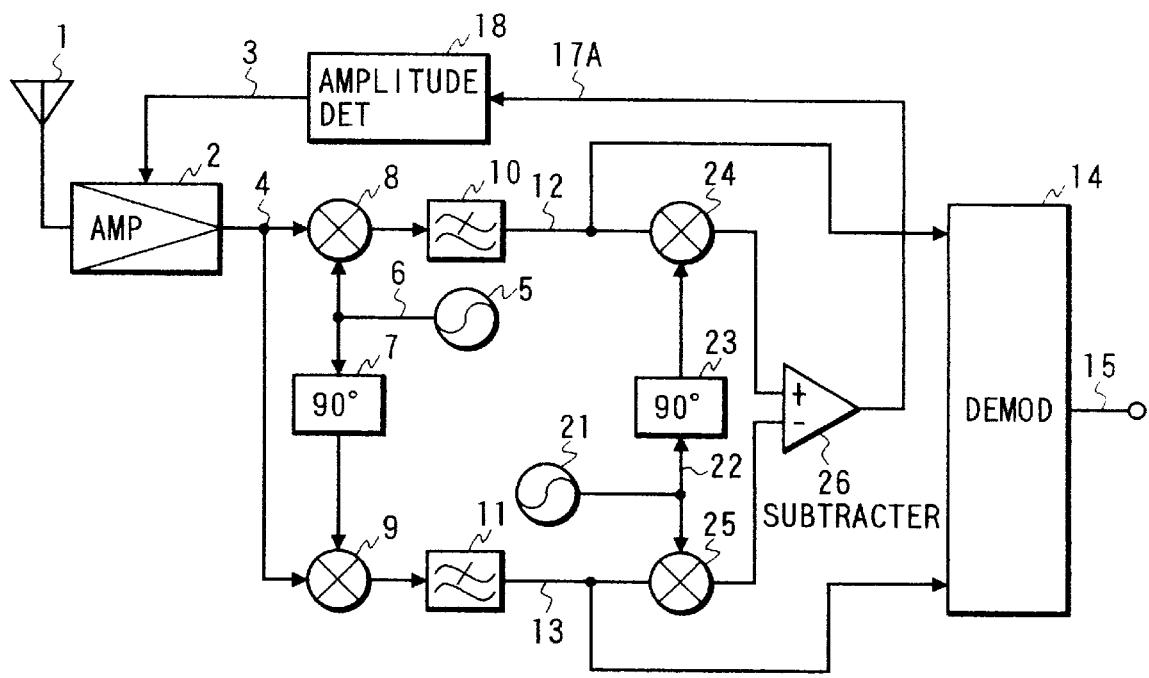
FIG. 13 is a block diagram of an FSK signal receiver according to a tenth embodiment of this invention.

FIG. 13 shows a tenth embodiment of this invention which is similar to the embodiment of FIG. 10 except that a local oscillator 21, a 90-degree phase shifter 23, mixers 24 and 25, and a subtracter 26 replace the mixer 16 of FIG. 10.

In the embodiment of FIG. 13, a baseband I signal 12 is applied to the mixer 24 from a low pass filter 10. A baseband Q signal 13 is applied to the mixer 25 from a low pass filter 11. A third local oscillator signal 22 is fed to the mixer 25 from the local oscillator 21. In addition, the third local oscillator signal 22 is fed to the 90-degree phase shifter 23 from the local oscillator 21. The device 23 shifts the phase of the third local oscillator signal 22 by 90 degrees, thereby converting the third local oscillator signal 22 into a fourth local oscillator signal. The fourth local oscillator signal is fed to the mixer 24 from the 90-degree phase shifter 23. Thus, the third and fourth local oscillator signals fed to the mixers 24 and 25 have a quadrature relation with each other. The frequency of the third and fourth local oscillator signals is set higher than the frequency of the baseband I and Q signals 12 and 13.

The device 25 mixes the baseband Q signal 13 and the third local oscillator signal 22. The output signal of the mixer 25 is applied to the subtracter 26. On the other hand, the device 24 mixes the baseband I signal 12 and the fourth local oscillator signal. The output signal of the mixer 24 is applied to the the subtracter 26. The device 26 subtracts the output signal of the mixer 24 from the output signal of the mixer 25, thereby generating a composite signal 17A. The subtracter 26 outputs the composite signal 17A to an amplitude detector 18.

Eleventh Embodiment

Figure 14:
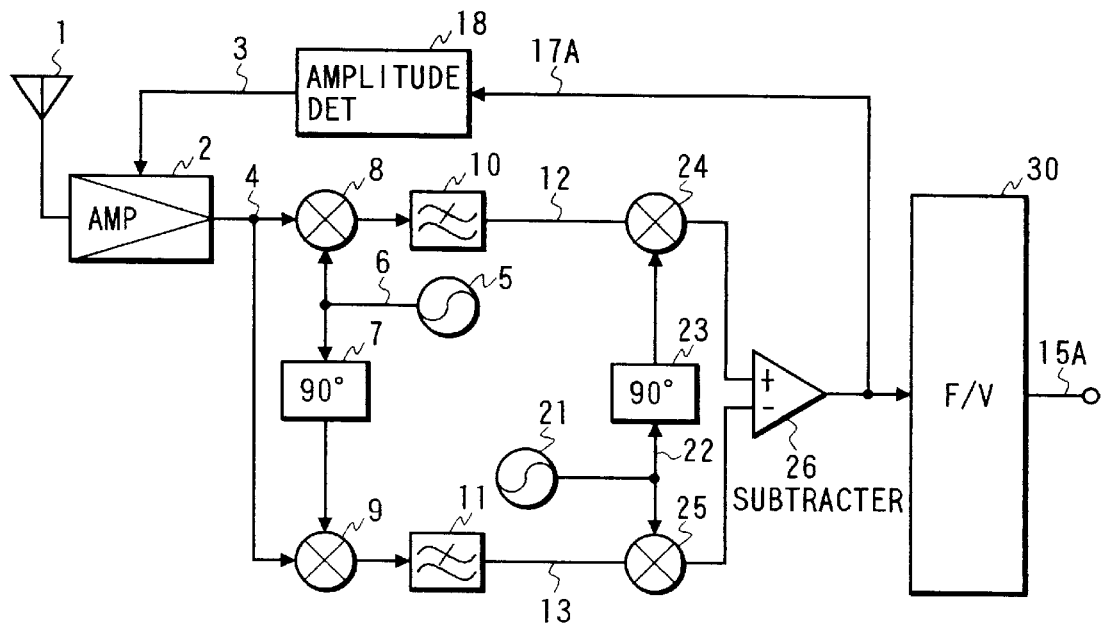
FIG. 14 is a block diagram of an FSK signal receiver according to an eleventh embodiment of this invention.

FIG. 14 shows an eleventh embodiment of this invention which is similar to the embodiment of FIG. 13 except that a frequency-to-voltage (F/V) converter 30 replaces the quadrature demodulator 14 of FIG. 13.

In the embodiment of FIG. 14, the F/V converter 30 receives a composite signal 17A from a subtracter 26. The F/V converter 30 recovers a baseband information signal 15A from the composite signal 17A through frequency-to-voltage conversion. The composite signal 17A agrees with an FSK signal which has a frequency deviation corresponding to the frequency of baseband I and Q signals 12 and 13, and which has a center frequency equal to the oscillation frequency of a local oscillator 21. A variation in the frequency of the composite signal 17A corresponds to a change in the frequency of a modulating signal. Therefore, the frequency-to-voltage conversion executed by the F/V converter 30 enables the detection of a change in the modulating signal and the recovery of the baseband information signal 15A.

Figure 15:
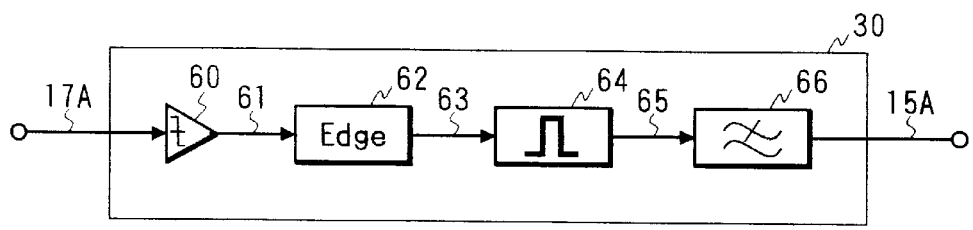
FIG. 15 is a block diagram of an F/V converter in FIG. 14.

FIG. 15 shows an example of the F/V converter 30. The F/V converter 30 of FIG. 15 includes an amplitude limiter 60, an edge detector 62, a pulse wave shaper 64, and a low pass filter 66. The composite signal 17A is made into a binary signal (a bi-level signal) 61 by the amplitude limiter 60. The edge detector 62 senses positive-going edges and negative-going edges in the binary signal 61. The edge detector 62 outputs one short pulse upon the detection of every edge. The pulse wave shaper 64 converts every pulse in the output signal 63 of the edge detector 62 into a pulse having a given width. The output signal 65 of the pulse wave shaper 64 is processed by the low pass filter 66, being made into the recovered baseband information signal 15A. The pulse wave shaper 64 includes, for example, a one-short multivibrator.

Figure 16:
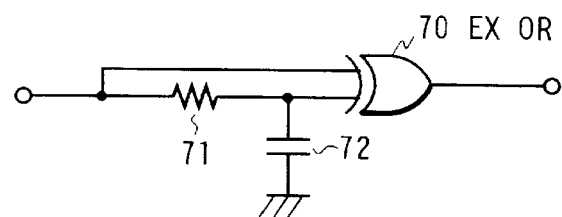
FIG. 16 is a block diagram of a first example of an edge detector in FIG. 15.

FIG. 16 shows a first example of the edge detector 62. The edge detector 62 of FIG. 16 includes an Exclusive-OR circuit 70, a resistor 71, and a capacitor 72. A first input terminal of the Exclusive-OR circuit 70 is connected to a detector input terminal. A second input terminal of the Exclusive-OR circuit 70 is connected via the resistor 71 to the detector input terminal. The second input terminal of the Exclusive-OR circuit 70 is grounded via the capacitor 72. The output terminal of the Exclusive-OR circuit 70 is connected to a detector output terminal. The resistor 71 and the capacitor 72 compose a delay circuit.

Figure 17:
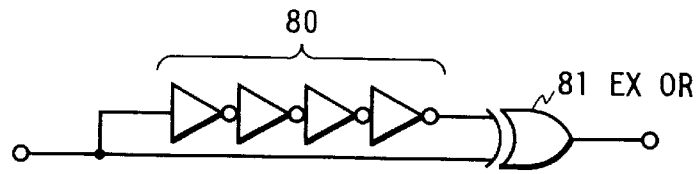
FIG. 17 is a block diagram of a second example of the edge detector in FIG. 15.

FIG. 17 shows a second example of the edge detector 62. The edge detector 62 of FIG. 17 includes a series combination 80 of invertors, and an Exclusive-OR circuit 81. A first input terminal of the Exclusive-OR circuit 81 is connected to a detector input terminal. A second input terminal of the Exclusive-OR circuit 81 is connected via the series combination 80 of the invertors to the detector input terminal. The output terminal of the Exclusive-OR circuit 81 is connected to a detector output terminal. The series combination 80 of the invertors forms a delay circuit.

Twelfth Embodiment

Figure 18:
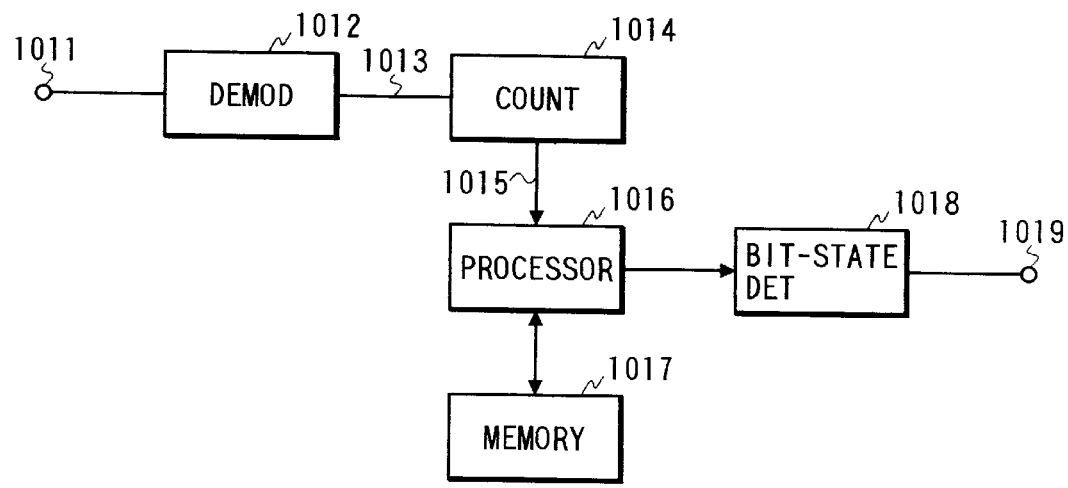
FIG. 18 is a block diagram of a time diversity receiver according to a twelfth embodiment of this invention.

With reference to FIG. 18, a time diversity receiver includes an input terminal 1011 sequentially followed by a demodulator 1012, a counter 1014, and a processor. 1016. A memory 1017 is connected to the processor 1016. The processor 1016 is sequentially followed by a bit-state detector 1018 and an output terminal 1019.

The demodulator 1012 recovers a baseband information signal 1013 from an input RF (radio frequency) signal transmitted via the input terminal 1011. The recovered baseband information signal 1013 is of the NRZ (non return to zero) type. The demodulator 1012 outputs the recovered baseband information signal 1013 to the counter 1014.

The counter 1014 includes a clock signal generator outputting a sampling clock signal which has a given frequency equal to a predetermined integer M times a frequency corresponding to the bit rate of transmitted data. The counter 1014 includes a comparator which decides whether or not the level of the baseband information signal 1013 exceeds a predetermined reference level. The comparator responds to the sampling clock signal so that the decision by the comparator is executed M times per bit. The counter 1014 includes a counting section following the comparator. For every bit, the counting section detects or calculates the number of times of the decision corresponding to the fact that the level of the baseband information signal 1013 exceeds the predetermined reference level. The predetermined reference level is equal to a code-state decision level (a logic-state decision level) for the baseband information signal 1013. The counting section outputs a count signal 1015 representative of the detected number of times to the processor 1016.

The processor 1016 reads out stored information ($Y_{k1}$, $Y_{k2}$, ..., $Y_{kn}$) from the memory 1017. For every bit, the processor 1016 adds a count signal $X_{(k+1)i}$ to the read-out information ($Y_{k1}$, $Y_{k2}$, ..., $Y_{kn}$), calculating $Y_{(k+1)i}=Y_{ki}+X_{(k+1)i}$. The count signal $X_{(k+1)i}$ corresponds to (k+1)-th received block data of N-bit block data retransmitted according to time diversity where $k \geq 0$. The stored information ($Y_{k1}$, $Y_{k2}$, ..., $Y_{kn}$) corresponds to the results of the reception of block data up to k-th block data. The processor 1016 outputs information of $Y_{(k+1)i}$ to the bit-state detector 1018. In addition, the processor 1016 updates the stored information in the memory 1017.

The bit-state detector 1018 includes a comparator. For every bit, the comparator determines whether or not the value of $Y_{(k+1)i}$ is smaller than a given reference value equal to M(k+1)/2. When the value of $Y_{(k+1)i}$ is smaller than the given reference value M(k+1)/2, the comparator outputs a one-bit signal $Z_{(k+1)i}$ of "0". When the value of $Y_{(k+1)i}$ is equal to or greater than the given reference value M(k+1)/2, the comparator outputs a one-bit signal $Z_{(k+1)i}$ of "1". The one-bit signal $Z_{(k+1)i}$ outputted from the comparator constitutes a recovered bit of received block data which is fed to the output terminal 1019 from the bit-state detector 1018.

The processor 1016 repeats the previously-indicated processes a number of times which is equal to the number of times of the retransmission of a same block data according to time diversity. When new data block is transmitted, the processor 1016 clears the memory 1017.

The counting section in the counter 1014 may detect or calculate the number of times of the decision corresponding to the fact that the level of the baseband information signal 1013 does not exceed the predetermined reference level.

Figure 19:
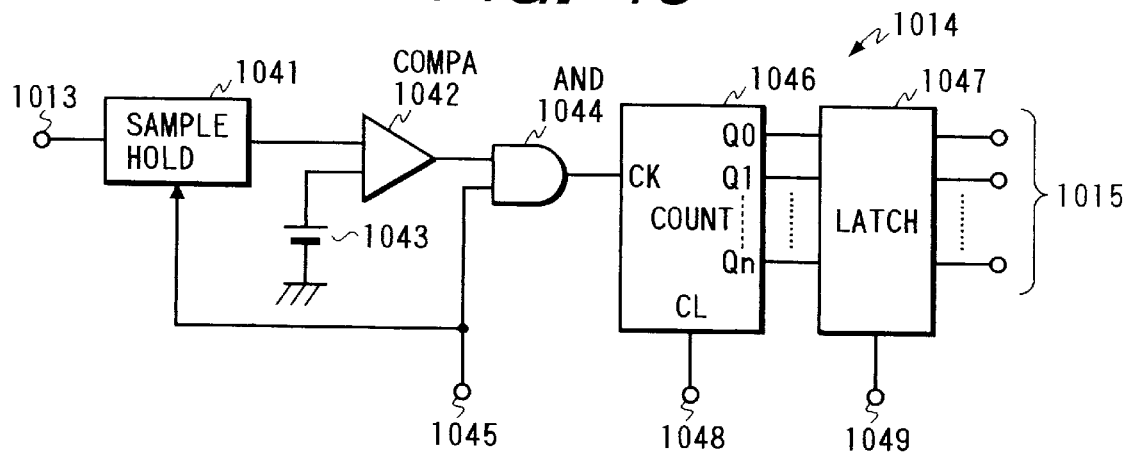
FIG. 19 is a block diagram of a counter in FIG. 18.

FIG. 19 shows an example of the counter 1014. The counter 1014 of FIG. 19 includes a sample-and-hold circuit 1041, a voltage comparator 1042, a voltage source 1043, an AND circuit 1044, a counting section 1046, and a latch 1047. The circuit 1041 periodically samples and holds the recovered baseband information signal 1013 in response to a sampling clock signal 1045. The frequency of the sampling clock signal 1045 is equal to a given integer M (for example, equal to or greater than 2) times the frequency corresponding to the bit rate of transmitted data. Every sample of the baseband information signal 1013 is fed from the sample-and-hold circuit 1041 to the voltage comparator 1042. The voltage source 1043 feeds a predetermined reference voltage to the voltage comparator 1042. The device 1042 compares the voltage of every sample of the baseband information signal 1013 with the reference voltage. When the voltage of every sample of the baseband information signal 1013 exceeds the reference voltage, the voltage comparator 1042 outputs a high-level signal. Otherwise, the voltage comparator 1042 outputs a low-level signal. The output signal of the voltage comparator 1042 is applied to a first input terminal of the AND circuit 1044. A second input terminal of the AND circuit 1044 receives the sampling clock signal 1045. The AND circuit 1044 periodically gates the output signal of the voltage comparator 1042 in response to the sampling clock signal 1045. The output signal of the AND circuit 1044 is applied to the clock input terminal of the counting section 1046. The clear terminal of the counting section 1046 receives a bit sync signal 1048. The counting section 1046 counts pulses outputted from the AND circuit 1044 during every one-bit interval, thereby detecting an intra-bit signal width Li. The counting section 1046 outputs a signal representing the counted pulse number. The output signal of the counting section 1046 is periodically cleared to "0" in response to the bit sync signal 1048. The device 1047 latches the output signal of the counting section 1046 in response to a data latch signal 1049 at every moment immediately before the counting section 1046 is cleared. The output signal of the latch 1047 constitutes the count signal 1015.

Thirteenth Embodiment

Figure 20:
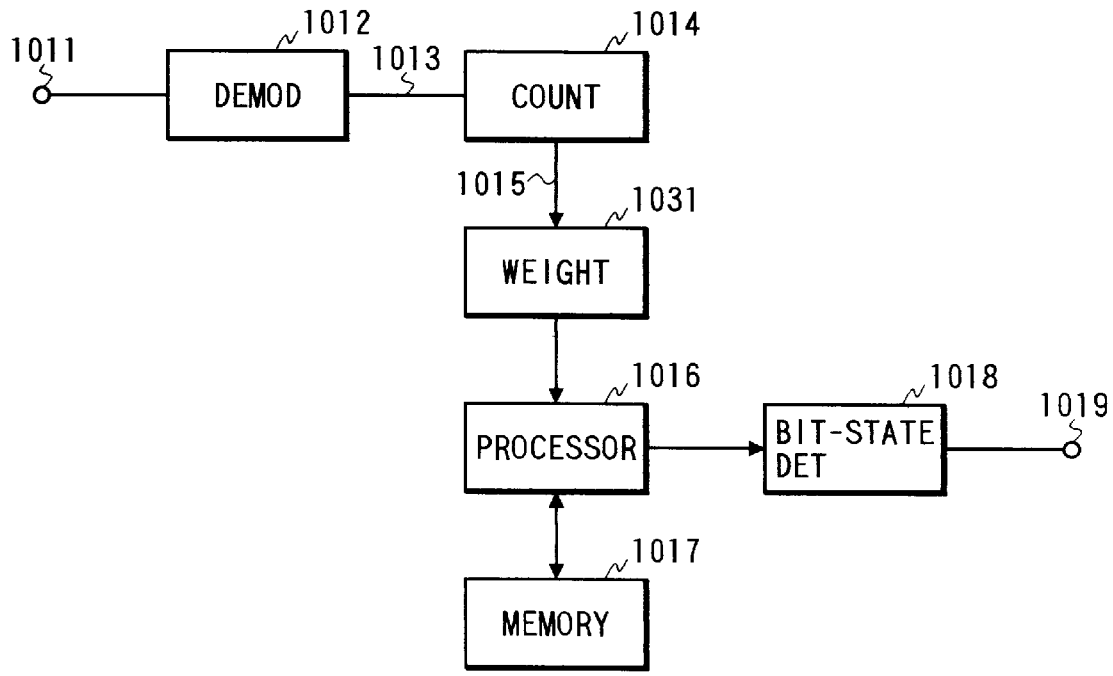
FIG. 20 is a block diagram of a time diversity receiver according to a thirteenth embodiment of this invention.

FIG. 20 shows a thirteenth embodiment of this invention which is similar to the embodiment of FIG. 18 except that a weighting device 1031 is additionally provided between a counter 1014 and a processor 1016.

The weighting device 1031 receives a count signal 1015 from the counter 1014, and weights the count signal into a weighting-resultant count signal. The weighting device 1031 outputs the weighting-resultant count signal to the processor 1016. The device 1016 processes the weighting-resultant count signal.

Figure 21:
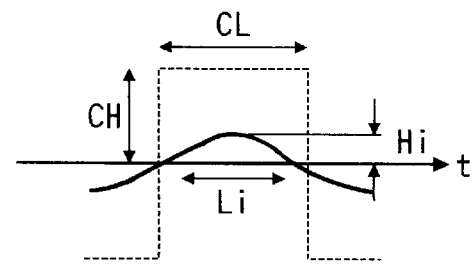
FIG. 21 is a time-domain diagram of a recovered baseband information signal which occurs under conditions where an electric field related to an input RF signal is relatively weak.
Figure 22:
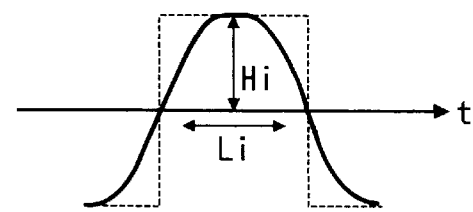
FIG. 22 is a time-domain diagram of a recovered baseband information signal which occurs under conditions where an electric field related to an input RF signal is medium in strength.
Figure 23:
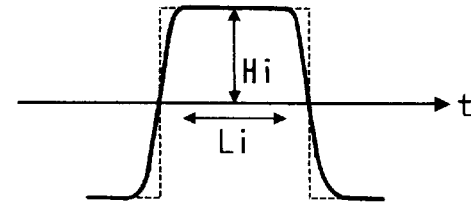
FIG. 23 is a time-domain diagram of a recovered baseband information signal which occurs under conditions where an electric field related to an input RF signal is relatively strong.

It is now assumed that a recovered baseband information signal 1013 corresponding to transmitted NRZ bit data has a sinusoidal waveform. Under conditions where an electric field related to an input RF signal is relatively weak, the recovered baseband information signal 1013 has a waveform such as shown in FIG. 21. Under conditions where the electric field related to the input RF signal is medium in strength, the recovered baseband information signal 1013 has a waveform such as shown in FIG. 22. Under conditions where the electric field related to the input RF signal is relatively strong, the recovered baseband information signal 1013 has a waveform such as shown in FIG. 23.

In weak and medium ranges of the electric field related to the input RF signal, the quantization level Hi increases as the intra-bit signal width Li increases (see FIGS. 21 and 22). Specifically, the quantization level Hi and the intra-bit signal width Li have a relation as:

$$Hi = CH \cdot \sin\{\pi(Li - CL/2)/CL\}$$

where CH denotes a bit amplitude length: CL denotes a bit time length; and Li<CL. In a strong range of the electric field related to the input RF signal where Li≧CL as shown in FIG. 23, the quantization level Hi is equal to a constant value and is specifically given as Hi=CH. As understood from the previous description, the quantization level Hi can be estimated from the intra-bit signal width Li.

The weighting process executed by the weighting device 1031 is designed to correspond to the previously-indicated relation between the quantization level Hi and the intra-bit signal width Li. The weighting device 1031 includes, for example, a ROM (read only memory).

In the case where Li<CL, the relation between the quantization level Hi and the intra-bit signal width Li may be regarded as Hi=Li.

Fourteenth Embodiment

Figure 24:
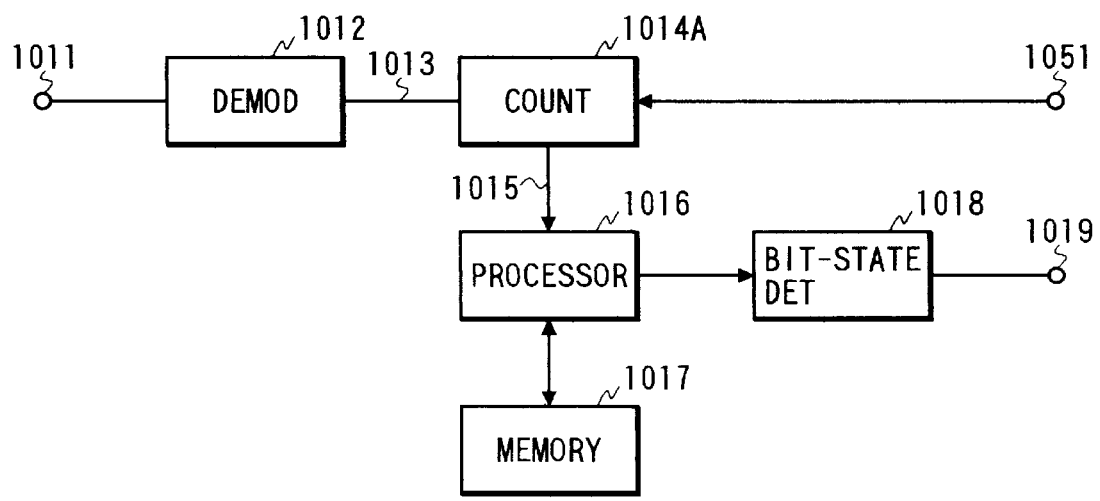
FIG. 24 is a block diagram of a time diversity receiver according to a fourteenth embodiment of this invention.

FIG. 24 shows a fourteenth embodiment of this invention which is similar to the embodiment of FIG. 18 except that a counter 1014A replaces the counter 1014 of FIG. 18. In the embodiment of FIG. 24, the counter 1014A responds to a count mask signal 1051.

Figure 25:
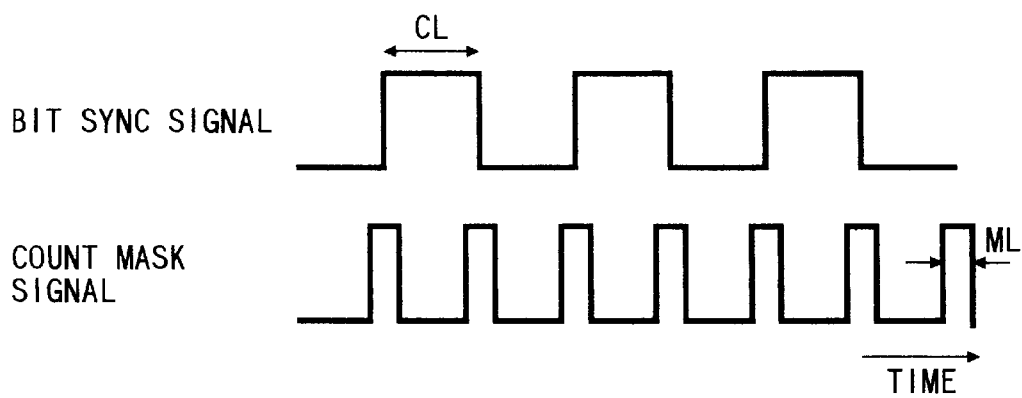
FIG. 25 is a time-domain diagram of a bit sync signal and a count mask signal in the time diversity receiver of FIG. 24.

As shown in FIG. 25, the count mask signal 1051 has a train of positive pulses synchronous with rising and falling edges in a bit sync signal. The pulses in the count mask signal 1051 have a given width ML. Periods during which the pulses in the count mask signal 1051 are present cover the respective moments of the occurrence of the rising and falling edges in the bit sync signal.

The counter 1014A inhibits a counting process in the presence of every pulse in the count mask signal 1051. The counter 1014A executes the counting process in the absence of a pulse in the count mask signal 1051.

Figure 26:
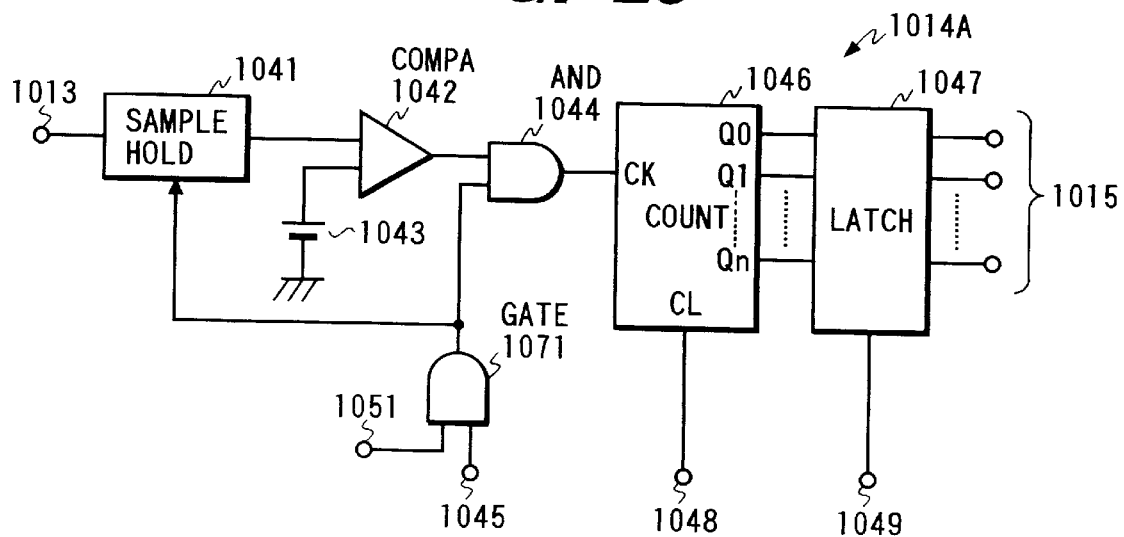
FIG. 26 is a block diagram of a counter in FIG. 24.

FIG. 26 shows an example of the counter 1014A. The counter 1014A of FIG. 26 includes a sample-and-hold circuit 1041, a voltage comparator 1042, a voltage source 1043, an AND circuit 1044, a counting section 1046, a latch 1047, and a gate circuit 1071.

A first input terminal of the gate circuit 1071 receives a sampling clock signal 1045. A second input terminal of the gate circuit 1071 receives the count mask signal 1051. The output terminal of the gate circuit 1071 is connected to the sample-and-hold circuit 1041 and the AND circuit 1044. The gate circuit 1071 is closed and opened in response to the count mask signal 1051. In the presence of a pulse in the count mask signal, the sampling clock signal is inhibited from traveling to the sample-and-hold circuit 1041 and the AND circuit 1044 through the gate circuit 1071. In the absence of a pulse in the count mask signal, the sampling clock signal is enabled to travel to the sample-and-hold circuit 1041 and the AND circuit 1044 through the gate circuit 1071.

The circuit 1041 periodically samples and holds a recovered baseband information signal 1013 in response to the sampling clock signal 1045 fed via the gate circuit 1071. The frequency of the sampling clock signal 1045 is equal to a given integer M (for example, equal to or greater than 2) times the frequency corresponding to the bit rate of transmitted data. Every sample of the baseband information signal 1013 is fed from the sample-and-hold circuit 1041 to the voltage comparator 1042. The voltage source 1043 feeds a predetermined reference voltage to the voltage comparator 1042. The device 1042 compares the voltage of every sample of the baseband information signal 1013 with the reference voltage. When the voltage of every sample of the baseband information signal 1013 exceeds the reference voltage, the voltage comparator 1042 outputs a high-level signal. Otherwise, the voltage comparator 1042 outputs a low-level signal. The output signal of the voltage comparator 1042 is applied to a first input terminal of the AND circuit 1044. A second input terminal of the AND circuit 1044 receives the sampling clock signal 1045 from the gate circuit 1071. The AND circuit 1044 periodically gates the output signal of the voltage comparator 1042 in response to the sampling clock signal 1045. The output signal of the AND circuit 1044 is applied to the clock input terminal of the counting section 1046. The clear terminal of the counting section 1046 receives a bit sync signal 1048. The counting section 1046 counts pulses outputted from the AND circuit 1044 during every one-bit interval, thereby detecting an intra-bit signal width Li. The counting section 1046 outputs a signal representing the counted pulse number. The output signal of the counting section 1046 is periodically cleared to "0" in response to the bit sync signal 1048. The device 1047 latches the output signal of the counting section 1046 in response to a data latch signal 1049 at every moment immediately before the counting section 1046 is cleared. The output signal of the latch 1047 constitutes the count signal 1015.

In the presence of a pulse in the count mask signal 1051, the AND circuit 1044 remains closed so that the AND circuit 1044 continues to be inhibited from outputting a pulse to the counting section 1046. Thus, in this case, a pulse counting process by the counting section 1046 is suspended. In the absence of a pulse in the count mask signal 1051, the AND circuit 1044 remains open so that the AND circuit 1044 continues to be enabled to output a pulse or pulses to the counting section 1046. Thus, in this case, the pulse counting process by the counting section 1046 is executed.

As previously described, periods during which the pulses in the count mask signal 1051 are present cover the respective moments of the occurrence of the rising and falling edges in the bit sync signal 1048. For example, the centers of the durations of the pulses in the count mask signal 1051 are coincident with the respective moments of the occurrence of the rising and falling edges in the bit sync signal 1048. Therefore, the counting process is inhibited during every period around the moment of the occurrence of a rising or falling edge in the bit sync signal 1048. In general, jitters tend to occur in the baseband information signal 1013 during periods around the moments of data-state changes, that is, the moments of the occurrence of rising and falling edges in the bit sync signal 1048. The above-indicated inhibition of the counting process prevents such jitters from adversely affecting the counting process.

Fifteenth Embodiment

Figure 27:
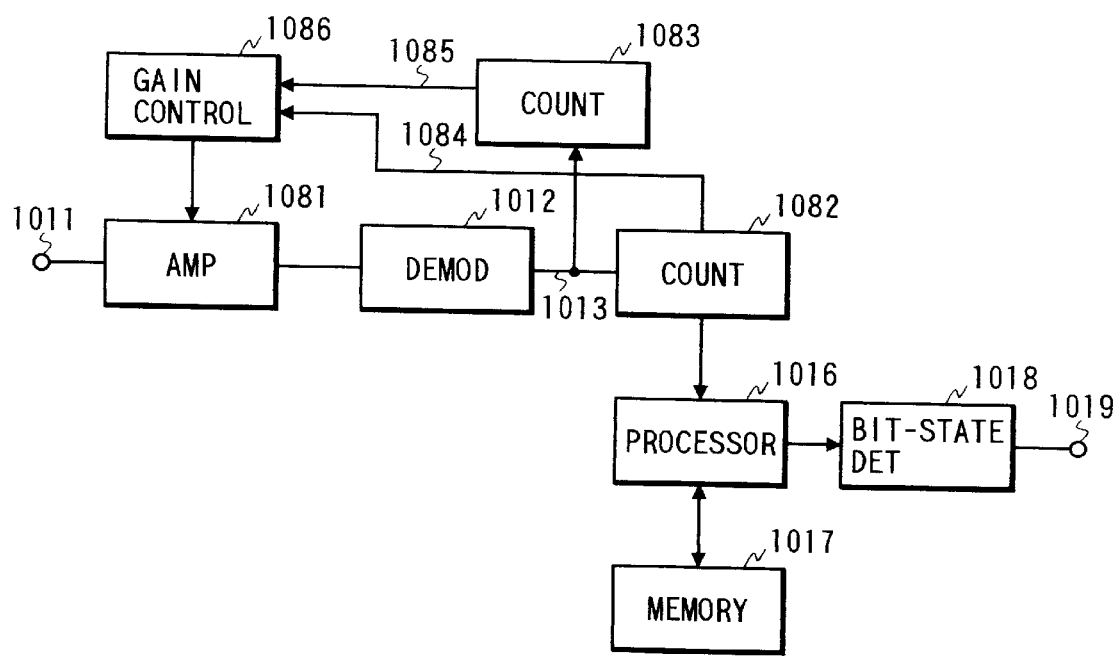
FIG. 27 is a block diagram of a time diversity receiver according to a fifteenth embodiment of this invention.

FIG. 27 shows a fifteenth embodiment of this invention which is similar to the embodiment of FIG. 18 except that a counter 1082 replaces the counter 1014 of FIG. 18, and that a variable-gain amplifier 1081, a counter 1083, and a gain controller 1086 are newly provided.

In the embodiment of FIG. 27, an input RF (radio frequency) signal is transmitted to a demodulator 1012 via an input terminal 1011 and the variable-gain amplifier 1081. The counter 1083 is connected to the demodulator 1012. The gain controller 1086 is connected to the counters 1082 and 1083, and the variable-gain amplifier 1081.

The counter 1082 is similar to the counter 1014 of FIG. 18. The counter 1082 uses a predetermined reference level L1 corresponding to a code-state decision level (a logic-state decision level) for a baseband information signal 1013. The counter 1082 outputs a count signal 1084 to a processor 1016 and the gain controller 1086.

The counter 1083 is similar to the counter 1082 except that the counter 1083 uses a predetermined reference level L2 rather than the predetermined reference level L1. The reference level L2 is higher than the reference level L1. The reference level L2 may be lower than the reference level L1. The counter 1083 generates a count signal 1085 in response to the baseband information signal 1013. The counter 1083 outputs the count signal 1085 to the gain controller 1086.

Only in the case where the number represented by the count signal 1084 exceeds a half of the number M of sampling times, the gain controller 1086 executes the following processes. The gain controller 1086 calculates the difference between the number represented by the count signal 1084 and the number represented by the count signal 1085. Then, the gain controller 1086 calculates the absolute value of the calculated difference. The gain controller 1086 increases the gain of the amplifier 1081 as the absolute value of the difference increases. It should be noted that the absolute value of the difference tends to be greater as an electric field related to the input RF signal drops. For example, the gain of the amplifier 1081 is made proportional to the absolute value of the difference. The gain of the amplifier 1081 may be varied stepwise in response to the absolute value of the difference.

There may be provided an additional counter similar to the counter 1082 except that the additional counter uses a predetermined reference level L3 chosen as L2>L1>L3 or L2<L1<L3. In this case, the gain controller 1086 responds also to a count signal outputted from the additional counter.

Sixteenth Embodiment

Figure 28:
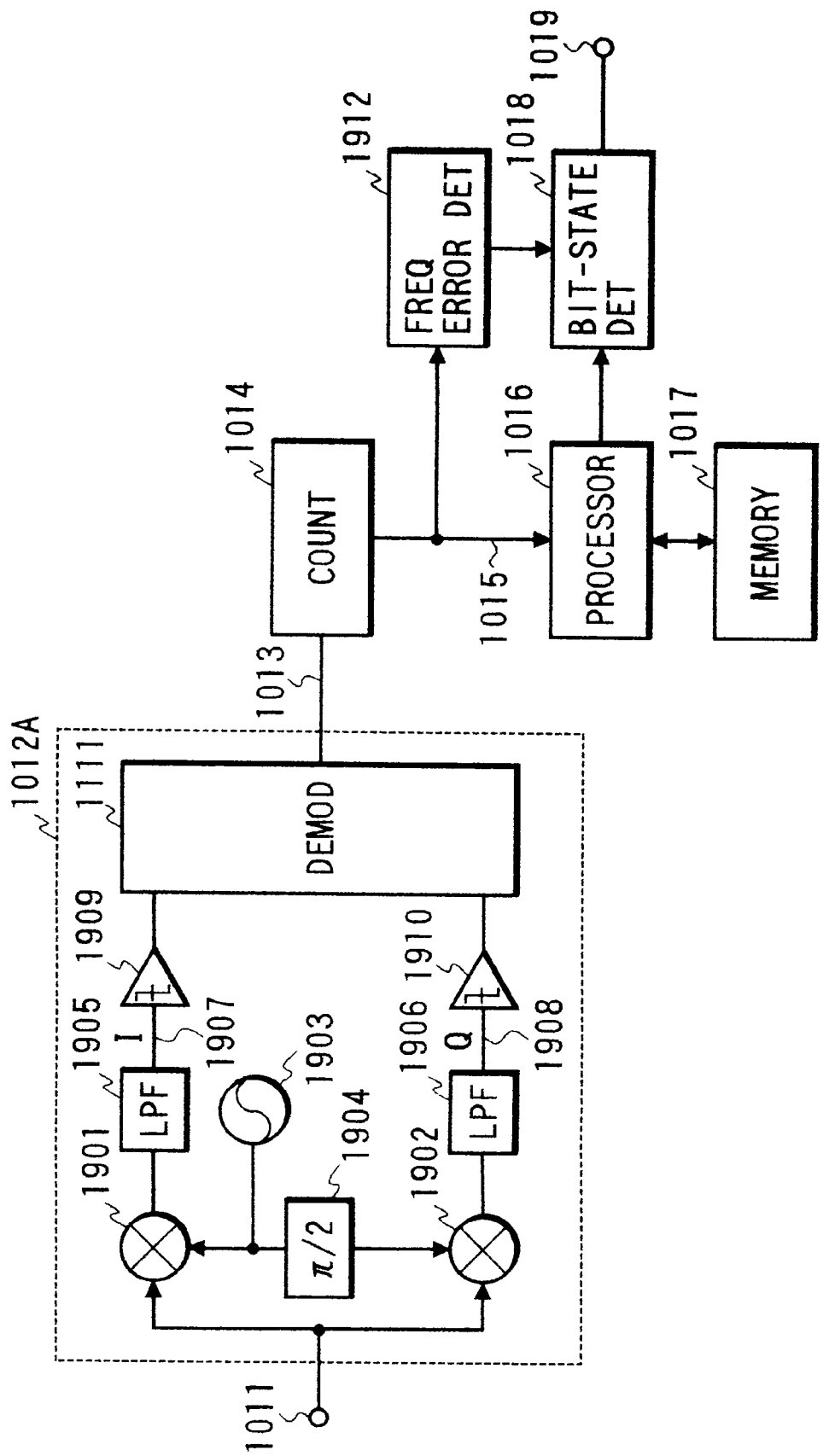
FIG. 28 is a block diagram of a time diversity receiver according to a sixteenth embodiment of this invention.

With reference to FIG. 28, a time diversity receiver includes an input terminal 1011 sequentially followed by a demodulator 1012A and a counter 1014. The counter 1014 is followed by a processor 1016 and a frequency error detector 1912. A memory 1017 is connected to the processor 1016. The processor 1016 is sequentially followed by a bit-state detector 1018 and an output terminal 1019. The bit-state detector 1018 is also connected to the frequency error detector 1912.

The demodulator 1012A recovers a baseband information signal 1013 from an input RF (radio frequency) signal transmitted via the input terminal 1011. The demodulator 1012A includes mixers 1901 and 1902, a local oscillator 1903, a 90-degree phase shifter 1904, low pass filters 1905 and 1906, amplitude limiters 1909 and 1910, and a quadrature demodulating section 1111.

In the case where the input RF signal agrees with a bi-level RF FSK signal, the frequency of the input RF signal is expressed as fc±σ where "fc" denotes the carrier frequency of the input RF signal and "σ" denotes a frequency deviation. The input RF signal is fed to the mixers 1901 and 1902. A first RF local oscillator signal is fed to the mixer 1901 from the local oscillator 1903. In addition, the first RF local oscillator signal is fed to the 90-degree phase shifter 1904 from the local oscillator 1903. The device 1904 shifts the phase of the first RF local oscillator signal by 90 degrees, thereby converting the first RF local oscillator signal into a second RF local oscillator signal. The second RF local oscillator signal is fed to the mixer 1902 from the 90-degree phase shifter 1903. Thus, the first and second RF local oscillator signals fed to the mixers 1901 and 1902 have a quadrature relation with each other. The frequency of the first and second RF local oscillator signals is set substantially equal to the carrier frequency "fc" of a handled RF FSK signal. The device 1901 mixes the input RF signal and the first RF local oscillator signal, converting the Input RF signal into a signal containing a baseband I (in-phase) signal. The output signal of the mixer 1901 contains unnecessary high-frequency components in addition the the baseband I signal. The low pass filter 1905 which follows the mixer 1901 removes such high-frequency components from the output signal of the mixer 1901, thereby outputting the baseband I signal 1907. On the other hand, the device 1902 mixes the input RF signal and the second RF local oscillator signal, converting the input RF signal into a signal containing a baseband Q (quadrature phase) signal. The output signal of the mixer 1902 contains unnecessary high-frequency components in addition the the baseband Q signal. The low pass filter 1906 which follows the mixer 1902 removes such high-frequency components from the output signal of the mixer 1902, thereby outputting the baseband Q signal 1908. The baseband I signal 1907 and the baseband Q signal 1908 are expressed as follows.

$I$ signal=cos $\{2\pi(\sigma\pm\Delta f)t\}$ $Q$ signal=±sin $\{2\pi(\sigma\pm\Delta f)t\}$ where "Δf" denotes the error between the carrier frequency of the input RF signal and the frequency of the first and second RF local oscillator signals.

The baseband I signal 1907 is made by the amplitude limiter 1909 into a binary form (a bi-level form). The binary baseband I signal is outputted from the amplitude limiter 1909 to the quadrature demodulating section 1111. The baseband Q signal 1908 is made by the amplitude limiter 1910 into a binary form (a bi-level form). The binary baseband Q signal is outputted from the amplitude limiter 1910 to the quadrature demodulating section 1111.

The binary baseband I signal and the binary baseband Q signal have a quadrature relation with each other. For example, a data bit assumes a high-level state and a low level state when the phase of the binary baseband Q signal advances and retards from the phase of the binary baseband I signal respectively. The quadrature demodulating section 1111 senses the phase relation between the binary baseband I signal and the binary baseband Q signal. The quadrature demodulating section 1111 outputs a high-level voltage and a low-level voltage when the phase of the binary baseband Q signal advances and retards from the phase of the binary baseband I signal respectively. The output signal of the quadrature demodulating section 1111 has a binary form (a bi-level form). The output signal of the quadrature demodulating section 1111 constitutes a recovered baseband information signal 1013. The demodulator 1012A outputs the recovered baseband information signal 1013 to the counter 1014.

The counter 1014 includes a clock signal generator outputting a sampling clock signal which has a given frequency equal to a predetermined integer M times a frequency corresponding to the bit rate of transmitted data. The counter 1014 includes a comparator which decides whether or not the level of the baseband information signal 1013 exceeds a predetermined reference level. The comparator responds to the sampling clock signal so that the decision by the comparator is executed M times per bit. The counter 1014 includes a counting section following the comparator. For every bit, the counting section detects or calculates the number of times of the decision corresponding to the fact that the level of the baseband information signal 1013 exceeds the predetermined reference level. The predetermined reference level is equal to a code-state decision level (a logic-state decision level) for the baseband information signal 1013. The counting section outputs a count signal 1015 representative of the detected number of times to the processor 1016 and the frequency error detector 1912.

In a transmitted data block signal, bi-level reference data alternating between "0" and "1" recurs at a given period. When a given even number "s" of successive bits in the bi-level reference data has been received and processed by the counter 1014, the frequency error detector 1912 sums or adds the count results for the bits in the bi-level reference data. The frequency error detector 1912 calculates the difference Dc between the addition result and a given reference value Ls set as Ls=M·s/2 where "M" denotes the sampling number per bit. The difference Dc corresponds to a code-width difference (a bit-width difference or a frequency error). The code-width difference Dc is expressed as follows.

$$Dc = E(C1+C2) - M \cdot s/2$$

where C1 denotes a count result for a bit of "1" and C2 denotes a count result for a bit of "0".

The processor 1016 reads out stored information ($Y_{k1}$, $Y_{k2}$, ..., $Y_{kn}$) from the memory 1017. For every bit, the processor 1016 adds a count signal $X_{(k+1)i}$ to the read-out information ($Y_{k1}$, $Y_{k2}$, ..., $Y_{kn}$), calculating $Y_{(k+1)i} = Y_{ki} + X_{(k+1)i}$. The count signal $X_{(k+1)i}$ corresponds to (k+1)-th received block data of N-bit block data retransmitted according to time diversity where k≧0. The stored information ($Y_{k1}$, $Y_{k2}$, ..., $Y_{kn}$) corresponds to the results of the reception of block data up to k-th block data. The processor 1016 outputs information of $Y_{(k+1)i}$ to the bit-state detector 1018. In addition, the processor 1016 updates the stored information in the memory 1017.

The bit-state detector 1018 is informed of the code-width difference Dc by the frequency error detector 1912. The bit-state detector 1018 includes a comparator. For every bit, the comparator determines whether or not the value of Y(k+l)i is smaller than a given reference value equal to M(k+1)/2+αDc. When the value of $Y_{(k+1)i}$ is smaller than the given reference value M(k+1)/2+αDc, the comparator outputs a one-bit signal $Z_{(k+1)i}$ of "0". When the value of $Y_{(k+1)i}$ is equal to or greater than the given reference value M(k+1)/2+αDc, the comparator outputs a one-bit signal $Z_{(k+1)i}$ of "1". Here, "α" denotes a predetermined positive constant. The one-bit signal $Z_{(k+1)i}$ outputted from the comparator constitutes a recovered bit of received block data which is fed to the output terminal 1019 from the bit-state detector 1018.

The processor 1016 repeats the previously-indicated processes a number of times which is equal to the number of times of the retransmission of a same block data according to time diversity. When new data block is transmitted, the processor 1016 clears the memory 1017.

In the presence of an error "Δf" between the carrier frequency of the input RF signal and the local oscillator signal, the frequency of the baseband I and Q signals 1907 and 1908 corresponding to one of the two logic states is higher as indicated by "σ+Δf" while the frequency of the baseband I and Q signals 1907 and 1908 corresponding to the other logic state is lower as indicated "σ-Δf". Thus, in this case, there is a difference in modulation factor between a logic state of "0" and a logic state of "1".

Figure 29:
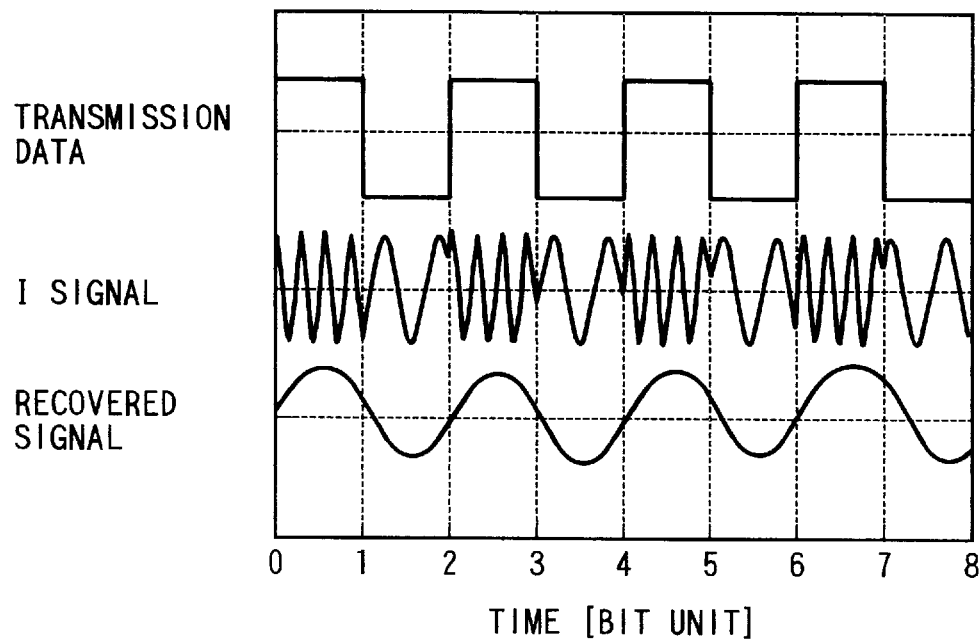
FIG. 29 is a time-domain diagram of transmitted data, a baseband I signal, and a baseband information signal in the time diversity receiver of FIG. 28.

FIG. 29 shows an example of conditions where a modulation factor for a bit of "1" is higher than a modulation factor for a bit of "0" due to the presence of a frequency error "Δf". In FIG. 29, successive bits in transmitted data alternate between "0" and "1". In this case, the baseband I signal 1907 and the baseband information signal 1013 have waveforms such as shown in FIG. 29. A first time interval is now defined as being equal to every period during which the voltage of the baseband information signal 1013 remains higher than the reference level. Further, a second time interval is now defined as being equal to every period during which the voltage of the baseband information signal 1013 remains lower than the reference level. The difference between the first time interval and the second time interval increases as the frequency error "Δf" increases. The code-width difference Dc is detected or calculated as an indication of the frequency error "Δf".

Figure 30:
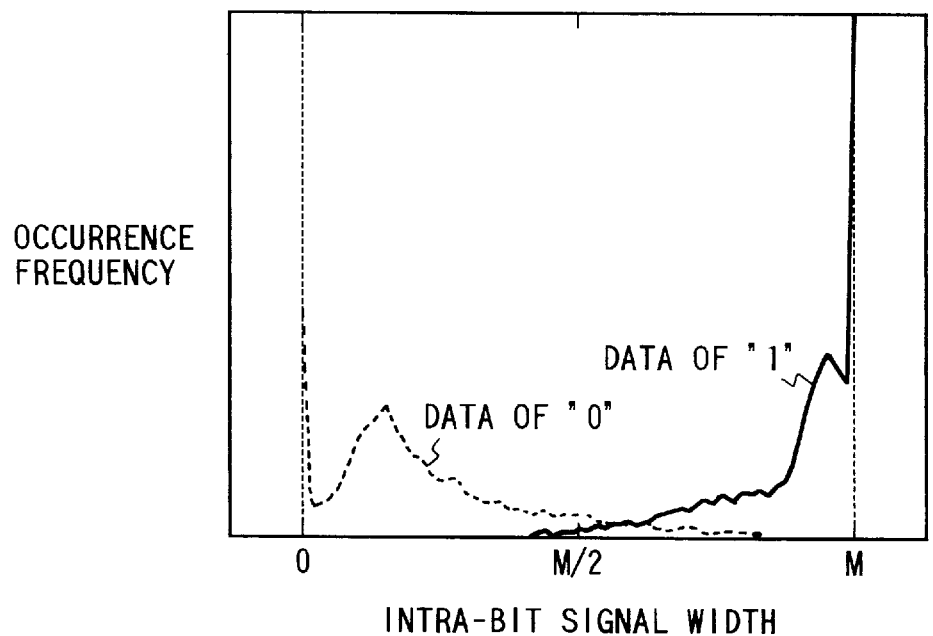
FIG. 30 is a diagram of distributions of intra-bit signal widths related to a baseband information signal.

FIG. 30 shows an example of the distributions of intra-bit signal widths related to the baseband information signal 1013 which occurs in the presence of a frequency error "Δf". Further, the conditions shown in FIG. 30 occur in the case where a modulation factor for a bit of "1" is higher than a modulation factor for a bit of "0".

The offset value αDc used in the bit-state detector 1018 is updated each time the frequency error detector 1912 executes the error detection process. The offset value αDc may be updated each time the frequency error detector 1912 repeats the error detection process a given plurality of times.

The offset value αDc may be varied stepwise in accordance with the code-width difference Dc. The offset value αDc may be limited to within a given range.

The local oscillator signal outputted from the local oscillator 1903 may be adjusted in response to the output signal of the frequency error detector 1912 to implement an AFC process.

Seventeenth Embodiment

Figure 31:
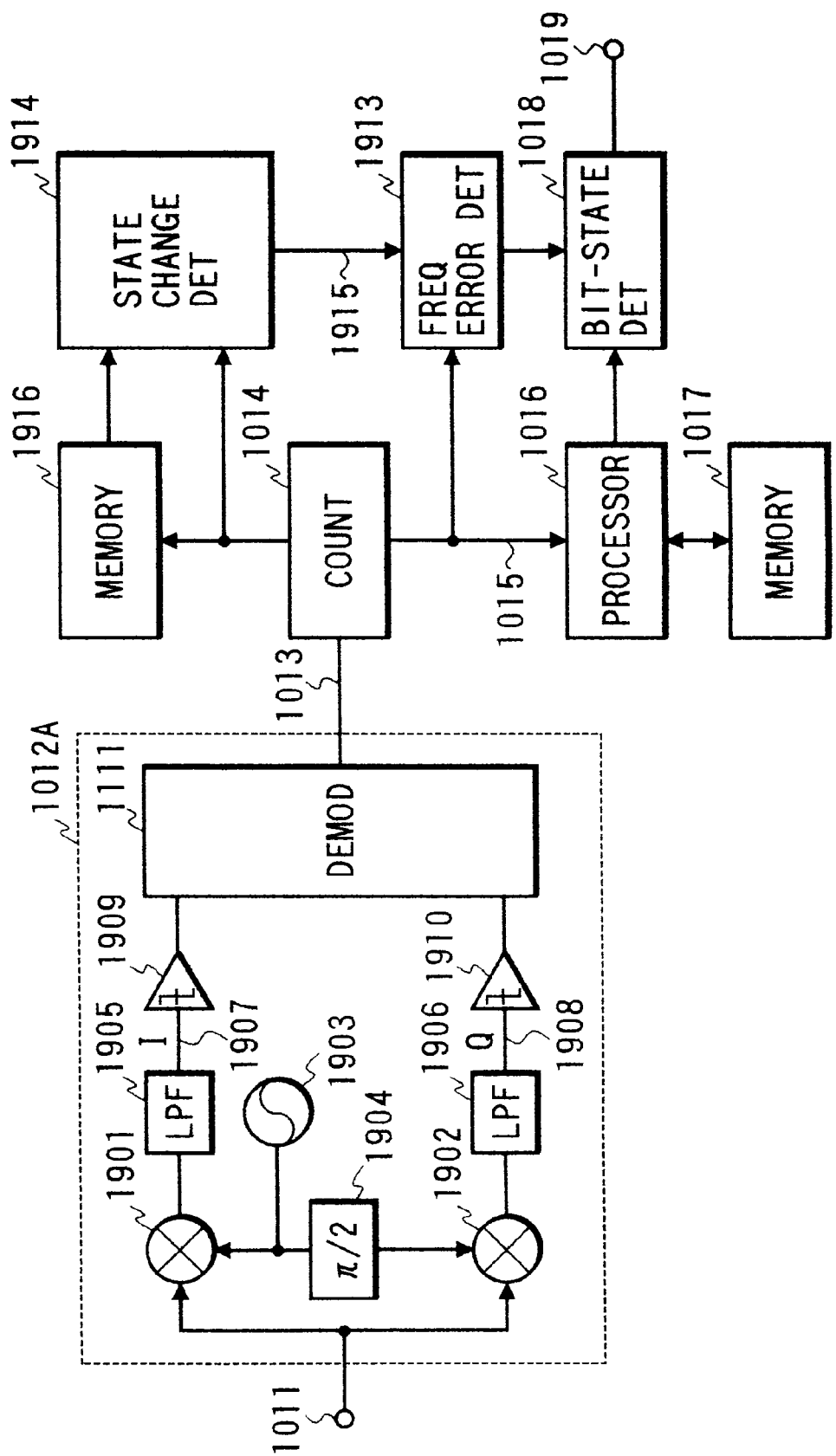
FIG. 31 is a block diagram of a time diversity receiver according to a seventeenth embodiment of this invention.

FIG. 31 shows a seventeenth embodiment of this invention which is similar to the embodiment of FIG. 28 except that a frequency error detector 1913 replaces the frequency error detector 1912 of FIG. 28, and that a state change detector 1914 and a memory 1916 are additionally provided.

In the embodiment of FIG. 31, the state change detector 1914 is connected to a counter 1014, the frequency error detector 1913, and the memory 1916. The memory 1916 is connected to the counter 1014.

Each time a new count signal 1015 is outputted from the counter 1014, the new count signal is stored into the memory 1916 while replacing a previous count signal. A new count signal and a previous count signal are now denoted by Li and Li-1 respectively. The state change detector 1914 is informed of the new count signal Li by the counter 1014. The state change detector 1914 is informed of the previous count signal Li-1 by the memory 1916. The state change detector 1914 calculates values "A" and "B" expressed as follows.

$$A = Li - M/2$$

$$B = Li\text{-}1 - M/2$$

The state change detector 1914 compares the signs of the values "A" and "B". When the signs of the values "A" and "B" are different, the state change detector 1914 outputs a high-level signal as an indication of the occurrence of a logic state change. When the signs of the values "A" and "B" are equal, the state change detector 1914 outputs a low-level signal. The output signal 1915 of the state change detector 1914 is applied to the frequency error detector 1913 as a state change detections signal.

Figure 32:
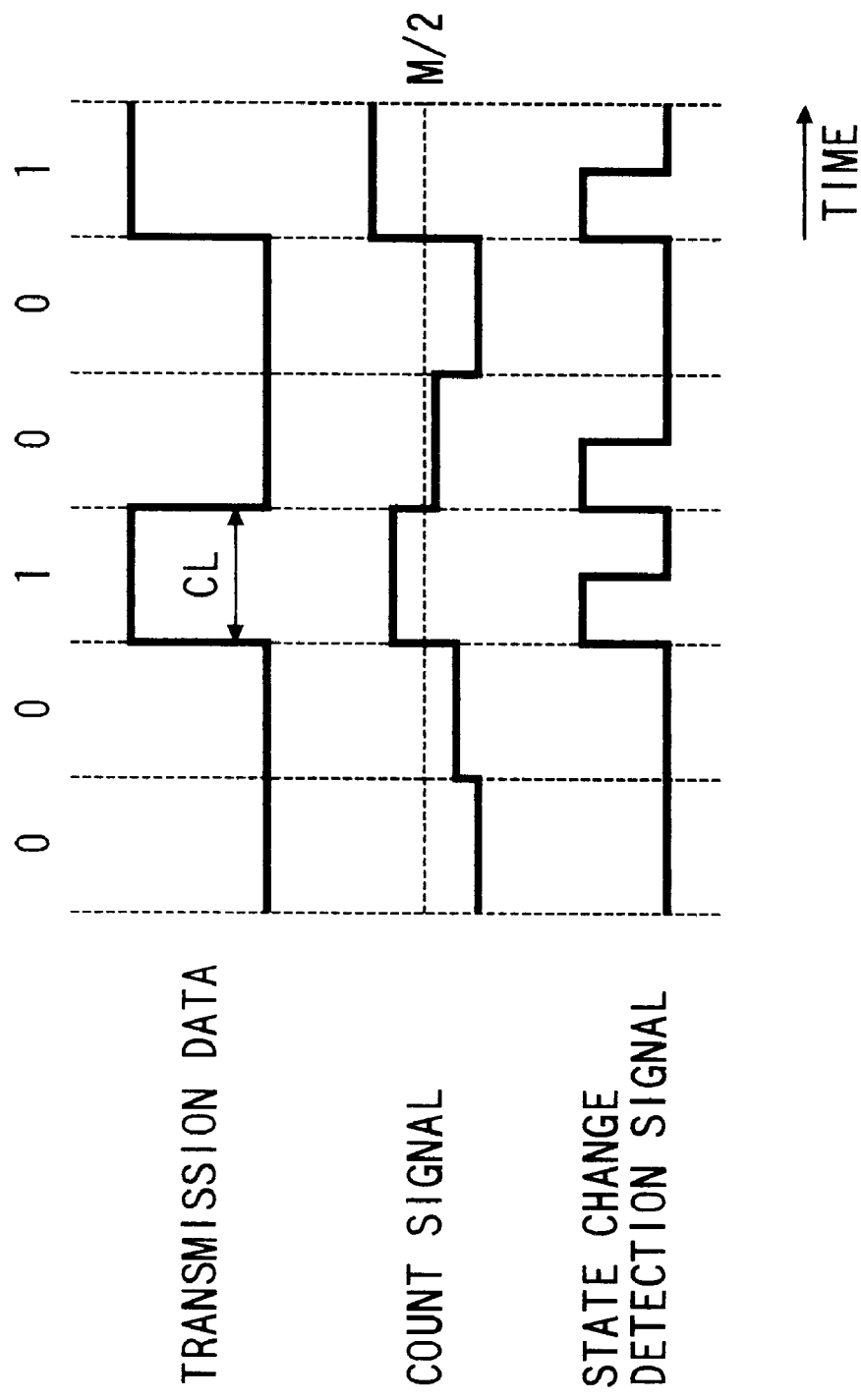
FIG. 32 is a time-domain diagram of transmitted data, a count signal, and a state change detection signal in the time diversity receiver of FIG. 31.

With reference to FIG. 32, in the case where transmitted data changes as "001001", the number represented by the count signal 1015 varies bit by bit. A high-level pulse occurs in the state change detection signal 1915 (the output signal of the state change detector 1914) each time the logic state of the transmitted data changes.

The frequency error detector 1913 is similar to the frequency error detector 1912 of FIG. 28 except that the frequency error detector 1913 responds to the state change detection signal 1915. The frequency error detector 1913 receives the count signal 1015 from the counter 1014. During the reception of a given number Nb of successive bits, the frequency error detector 1913 sums or adds the count results for bits which occur when the state change detection signal 1915 is in the high-level state. Each time the given number Nb of successive bits has been received and processed by the counter 1014, the frequency error detector 1913 calculates the difference Dc between the addition result Sb and a given reference value "SN·M/2" where "M" denotes the sampling number per bit and "SN" denotes the number of times of the addition. The difference Dc corresponds to a code-width difference (a bit-width difference or a frequency error). The code-width difference Dc is expressed as follows.

$$Dc = Sb - SN \cdot M/2$$

The frequency error detector 1913 informs the bit-state detector 1018 of the code-width difference Dc as a frequency error. The given number Nb of successive bits is set to correspond to, for example, a 1-block data length.

The code-width difference Dc may be calculated by referring to the following equation.

$$Dc = NT1 - NT2$$

where "NT1" denotes the number of times of the occurrence of Li≧M-β, and "NT2" denotes the number of times of the occurrence of Li≦β. Here, "β" denotes a predetermined positive constant.

The frequency error detector 1913 may continue the addition process until the number of times of the detection of a logic state change reaches a given number. The memory 1916 may be replaced by a memory in the state change detector 1914 which periodically stores data resulting from the state change detecting process on the count signal 1015.

An offset value αDc may be varied stepwise in accordance with the code-width difference Dc. The offset value αDc may be limited to within a given range.

A local oscillator signal outputted from a local oscillator 1903 may be adjusted in response to the output signal of the frequency error detector 1913 to implement an AFC process.

Eighteenth Embodiment

Figure 33:
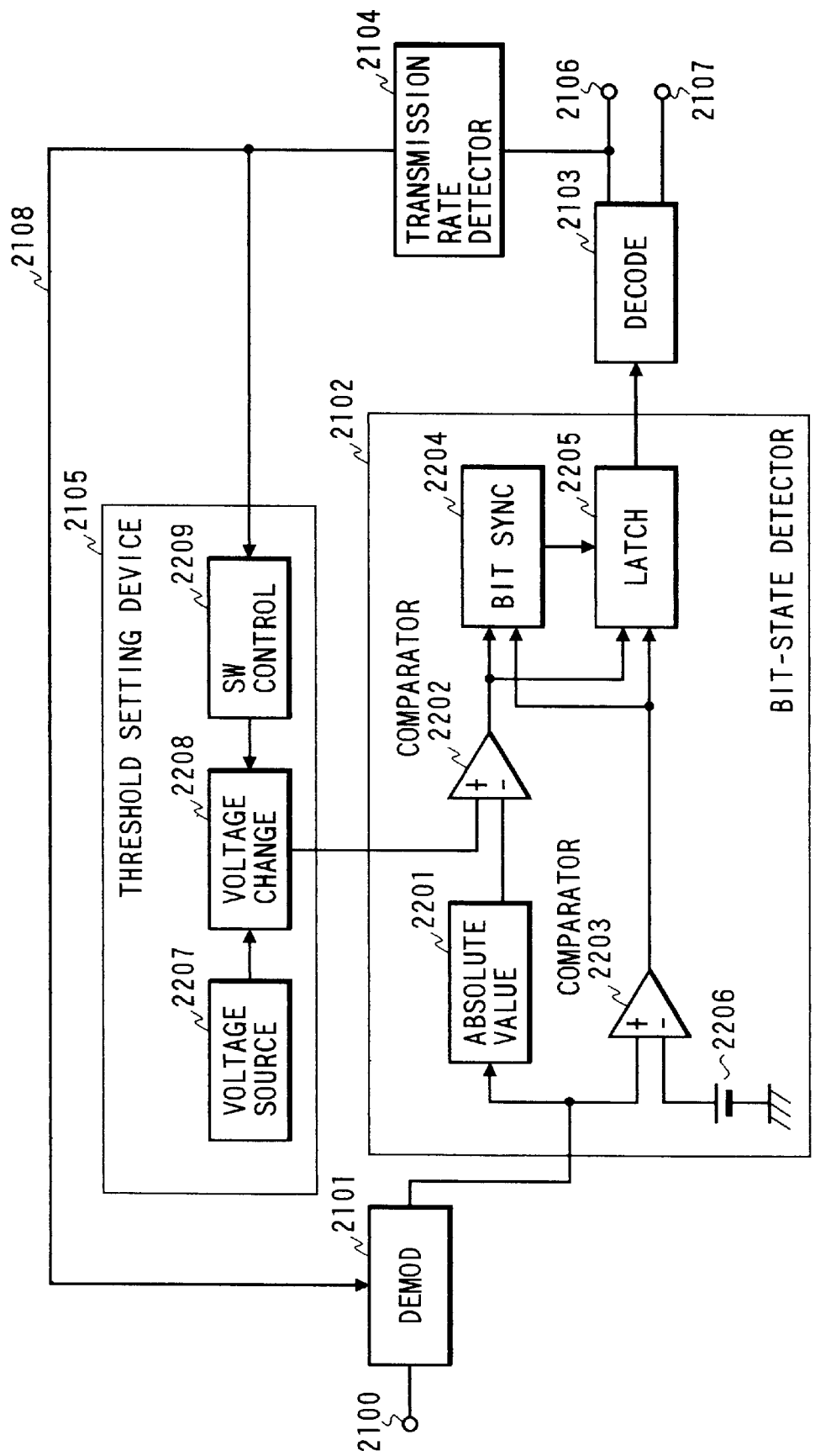
FIG. 33 is a block diagram of an FSK signal receiver according to an eighteenth embodiment of this invention.

With reference to FIG. 33, an FSK (frequency shift keyed) signal receiver includes a demodulator 2101 to which an RF (radio frequency) multi-value FSK signal is fed via a receiver input terminal 2100. The demodulator 2101 is successively followed by a bit-state detector 2102 and a decoder 2103. The decoder 2103 is connected to receiver output terminals 2106 and 2107. A transmission rate detector (data rate detector) 2104 is connected to the decoder 2103, the demodulator 2101, and a threshold setting device 2105. The threshold setting device 2105 is connected to the bit-state detector 2102.

An RF multi-value FSK signal handled by the FSK signal receiver of FIG. 33 has the following format. The RF multi-value FSK signal contains control information and main information. Control information is periodically transmitted at predetermined equal intervals. The transmission of the control information is implemented at a given constant rate. Main information is transmitted at a rate designated or represented by control information immediately preceding the main information. The RF multi-value FSK signal agrees with, for example, an RF 4-value FSK signal.

The demodulator 2101 outputs a signal having a voltage which is proportional to the instantaneous frequency of the RF multi-value FSK signal. The output signal of the demodulator 2101 is applied to the bit-state detector 2102. The bit-state detector 2102 executes a first decision (a bit-state decision) regarding the direction of a variation in the instantaneous frequency of the RF multi-value FSK signal relative to the carrier frequency thereof, and a second decision (an amplitude decision) regarding the width of the variation.

The bit-state detector 2102 includes an absolute value circuit 2201, comparators 2202 and 2203, a bit sync circuit 2204, and a latch 2205. The output signal of the demodulator 2101 is applied to the input terminal of the absolute value circuit 2201 and a first input terminal of the comparator 2203.

Regarding the amplitude decision, the absolute value circuit 2201 converts the output signal of the demodulator 2101 into a signal having a voltage which corresponds to the absolute value of the output signal of the demodulator 2101 with respect to a center equal to the bias voltage of the output signal of the demodulator 2101. The absolute value circuit 2101 outputs the voltage signal to a first input terminal of the comparator 2202. A second input terminal of the comparator 2202 receives a first threshold voltage from the threshold setting device 2105. As will be described later, the first threshold voltage is changeable. The device 2202 compares the voltage of the output signal of the absolute value circuit 2201 with the first threshold voltage. The comparator 2202 outputs a signal representative of the result of the comparison to the bit sync circuit 2204 and the latch 2205.

Regarding the bit-state decision, a second input terminal of the comparator 2203 receives a second threshold voltage from a voltage source 2206. The device 2203 compares the voltage of the output signal of the demodulator 2101 with the second threshold voltage. The comparator 2203 outputs a signal representative of the result of the comparison to the bit sync circuit 2204 and the latch 2205.

The bit sync circuit 2204 generates a bit sync signal in response to the output signals of the comparators 2202 and 2203. The bit sync signal is outputted from the bit sync circuit 2204 to the latch 2205 as a timing signal. The device 2205 latches the output signals of the comparators 2202 and 2203 at a timing determined by the output signal of the bit sync circuit 2204. The latched signals compose 2-bit data which is fed from the latch 2205 to the decoder 2103.

The device 2103 decodes the 2-bit data into control information and main information. The decoder 2103 feeds the control information and the main information to the receiver output terminals 2106 and 2107 respectively. In addition, the decoder 2103 feeds the control information to the transmission rate detector 2104. The transmission rate detector 2104 extracts or detects transmission rate information 2108 from the control information. The transmission rate detector 2104 feeds the transmission rate information 2108 to the demodulator 2101 and the threshold setting device 2105.

The demodulator 2101 executes the demodulating process at a rate corresponding to the transmission rate represented by the information 2108.

The threshold setting device 2105 includes a voltage source 2207, a voltage change device 2208, and a switch controller 2209. The voltage source 2207 feeds the voltage change device 2208 with a predetermined reference voltage. The voltage change device 2208 includes signal generators which produce different threshold voltages on the basis of the reference voltage. The switch controller 2209 converts the transmission rate information 2108 into a switch control signal. The switch controller 2209 outputs the switch control signal to the voltage change device 2208. The voltage change device 2208 includes a switch which selects one of the different threshold voltages in response to the switch control signal, and feeds the selected threshold voltage to the comparator 2202 within the bit-state detector 2102 as the first threshold voltage. In this case, the first threshold voltage corresponds to the transmission rate represented by the information 2108. Thus, the first threshold voltage is controlled in response to the transmission rate represented by the Information 2108.

It should be noted that a coupling circuit may be interposed between the demodulator 2101 and the bit-state detector 2102. The coupling circuit serves to remove an error from the central voltage of the output signal of the demodulator 2101 with respect to the bias voltage.

Nineteenth Embodiment

Figure 34:
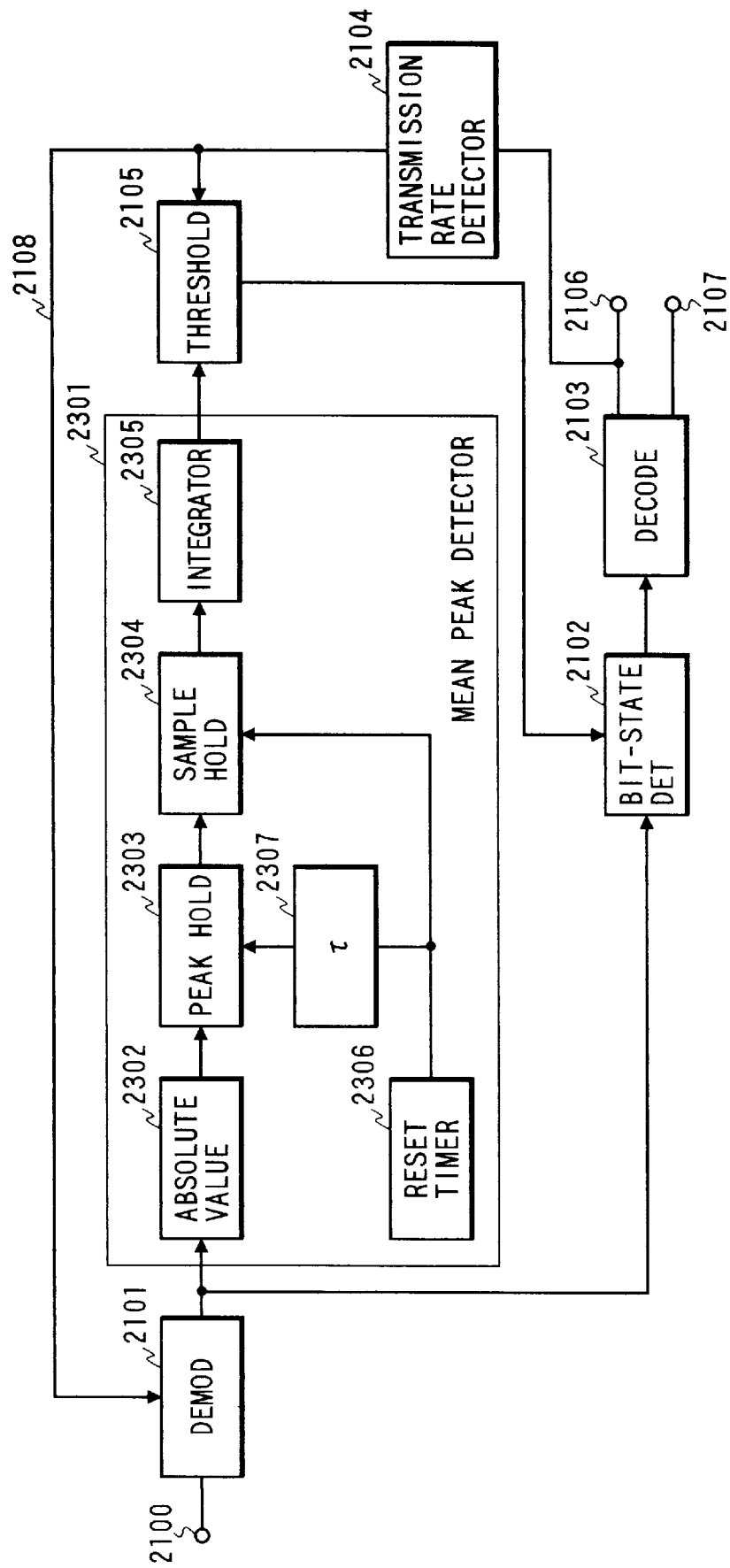
FIG. 34 is a block diagram of an FSK signal receiver according to a nineteenth embodiment of this invention.

FIG. 34 shows a nineteenth embodiment of this invention which is similar to the embodiment of FIG. 33 except that a threshold setting device 2105A replaces the threshold setting device 2105 of FIG. 33, and that a mean peak detector 2301 is additionally provided. The voltage source 2207 (see FIG. 33) is omitted from the threshold setting device 2105A. In other points, the threshold setting device 210SA is similar to the threshold setting device 2105 of FIG. 33.

In the embodiment of FIG. 34, the mean peak detector 2301 includes an absolute value circuit 2302, a peak hold circuit 2303, a sample-and-hold circuit 2304, an integrator 2305, a reset timer 2306, and a delay circuit 2307. The absolute value circuit 2302 follows a demodulator 2101. The absolute value circuit 2302 is sequentially followed by the peak hold circuit 2303, the sample-and-hold circuit 2304, and the integrator 2305. The integrator 2305 is connected to the threshold setting device 2105A. The reset timer 2306 is connected to the peak hold circuit 2303 via the delay circuit 2307. The reset timer 2306 is directly connected to the sample-and-hold circuit 2304.

The absolute value circuit 2302 converts the output signal of the demodulator 2101 into a signal having a voltage which corresponds to the absolute value of the output signal of the demodulator 2101 with respect to a center equal to the bias voltage of the output signal of the demodulator 2101. The absolute value circuit 2302 outputs the voltage signal to the peak hold circuit 2303. The reset timer 2306 outputs a reset pulse signal which has a period sufficiently longer than the period corresponding to one symbol of an RF multi-value FSK signal. The reset pulse signal is fed from the reset timer 2306 to the peak hold circuit 2303 via the delay circuit 2307. The circuit 2307 delays the reset pulse signal by a predetermined short interval. The reset pulse signal is directly fed from the reset timer 2306 to the sample-and-hold circuit 2304.

The circuit 2303 holds a voltage peak of the output signal of the absolute value circuit 2302 which occurs during every interval between the moments of the occurrence of two successive pulses in the delayed reset pulse signal. The peak hold circuit 2303 outputs the held peak to the sample-and-hold circuit 2304. The sample-and-hold circuit 2304 latches the output signal of the peak hold circuit 2303 in response to every pulse in the non-delayed reset pulse signal. The resultant output signal of the sample-and-hold circuit 2304 is fed to the integrator 2305. The device 2305 integrates the output signal of the sample-and-hold circuit 2304 over a given long time, thereby generating and outputting a signal representing a mean value of peaks of the output signal of the demodulator 2101. The output signal of the integrator 2305 is fed to a voltage change device 2208 (see FIG. 33) within the threshold setting device 2105A as a reference voltage.

Twentieth Embodiment

Figure 35:
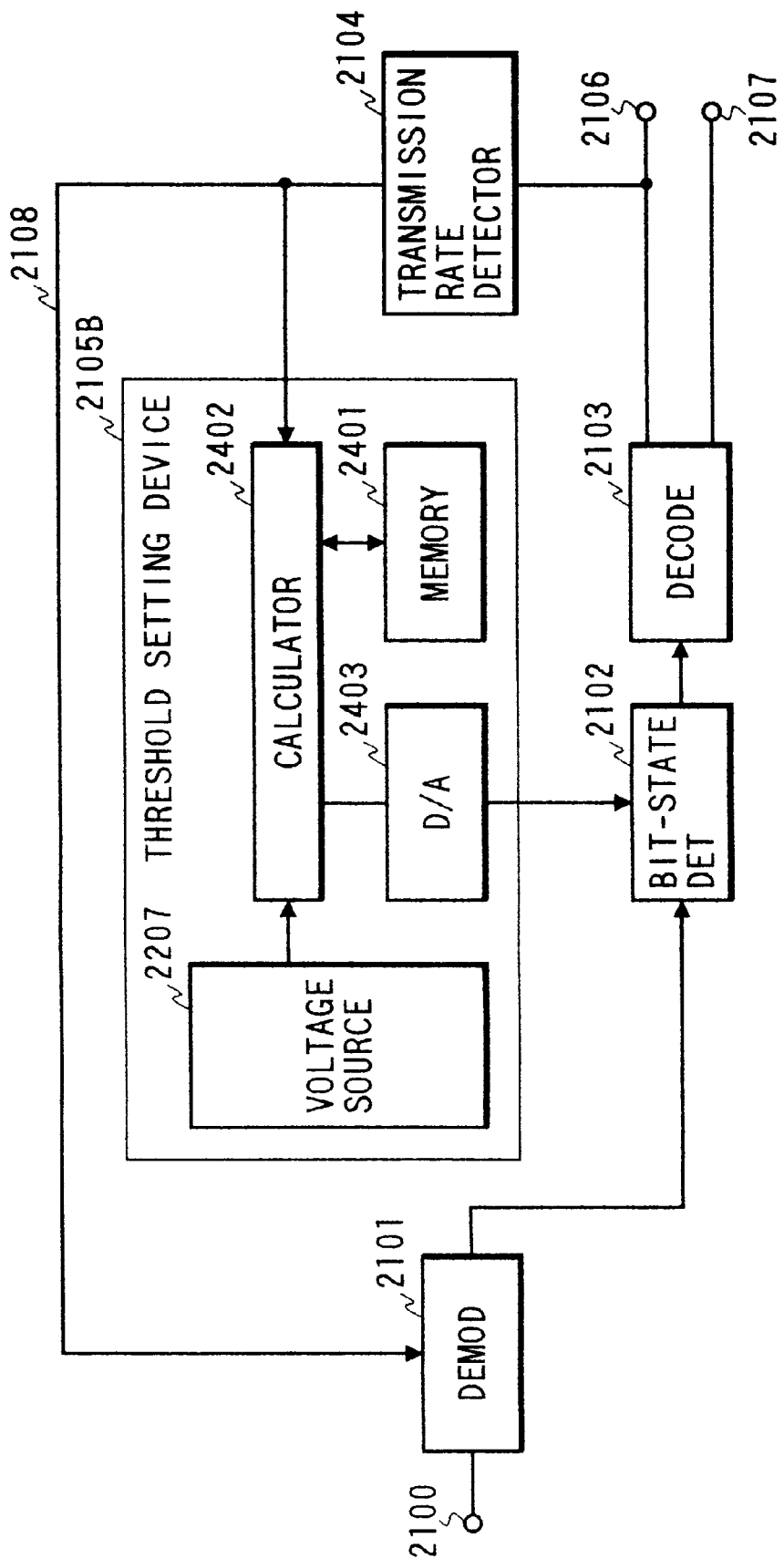
FIG. 35 is a block diagram of an FSK signal receiver according to a twentieth embodiment of this invention.

FIG. 35 shows a twentieth embodiment of this invention which is similar to the embodiment of FIG. 33 except that a threshold setting device 2105B replaces the threshold setting device 2105 of FIG. 33.

In the embodiment of FIG. 35, the threshold setting device 2105B includes a voltage source 2207, a memory 2401, a calculator 2402, and a D/A converter 2403. The voltage source 2207 feeds the calculator 2402 with a predetermined reference voltage. The memory 2401 is connected to the calculator 2402. The memory 2401 previously stores digital signals representing optimal threshold values for respective different transmission rates of an RF multi-value FSK signal. The calculator 2402 receives transmission rate information 2108 from a transmission rate detector 2104. The calculator 2402 reads out a digital signal of an optimal threshold value from the memory 2401 in accordance with the transmission rate information 2108. The calculator 2402 determines the value of a threshold voltage on the basis of the optimal threshold value and the value of the reference voltage. The calculator 2402 outputs a digital signal representative of the calculated value of the threshold voltage to the D/A converter 2403. The D/A converter 2403 changes the output signal of the calculator 2402 into the threshold voltage. The D/A converter 2403 feeds the threshold voltage to a bit-state detector 2102.

It should be noted that the voltage source 2207 may be replaced by a mean peak detector 2301 of FIG. 34.

Twenty-first Embodiment

Figure 36:
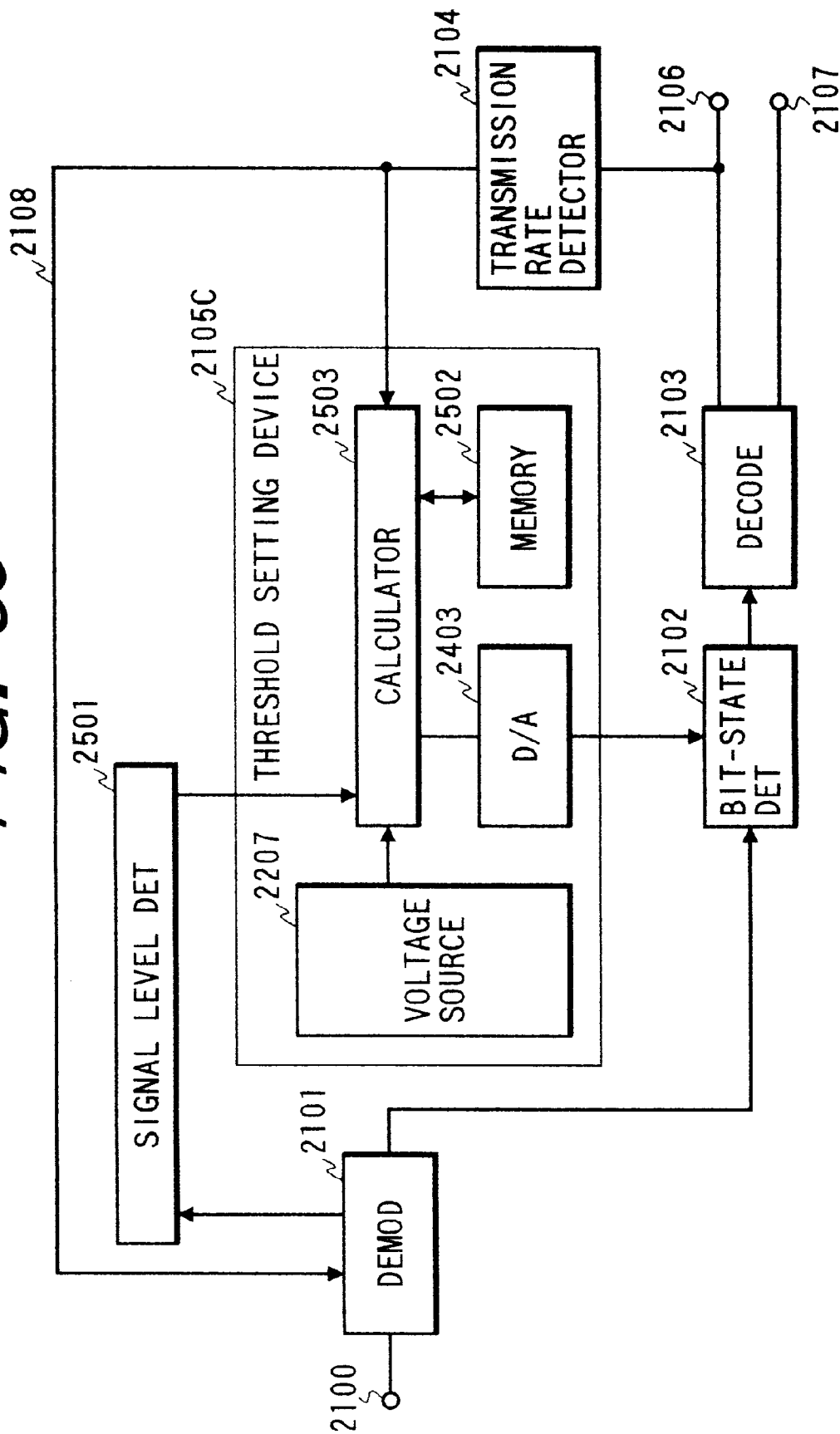
FIG. 36 is a block diagram of an FSK signal receiver according to a twenty-first embodiment of this invention.

FIG. 36 shows a twenty-first embodiment of this invention which is similar to the embodiment of FIG. 35 except that a threshold setting device 2105C replaces the threshold setting device 2105B of FIG. 35, and that a signal level detector 2501 is additionally provided.

In the embodiment of FIG. 36, the device 2501 detects the level (strength) of a received RF multi-value FSK signal by referring to the output signal of a demodulator 2101. The device 2501 informs the threshold setting device 2105C of the detected signal level (the detected signal strength).

In the embodiment of FIG. 36, the threshold setting device 2105C includes a voltage source 2207, a memory 2502, a calculator 2503, and a D/A converter 2403. The voltage source 2207 feeds the calculator 2503 with a predetermined reference voltage. The memory 2502 is connected to the calculator 2503. The memory 2503 previously stores digital signals representing optimal threshold values for respective different transmission rates of an RF multi-value FSK signal and also for respective different signal levels of the RF multi-value FSK signal. The calculator 2503 receives transmission rate information 2108 from a transmission rate detector 2104. The calculator 2503 is informed of the detected signal level by the signal level detector 2501. The calculator 2503 reads out a digital signal of an optimal threshold value from the memory 2502 in accordance with both the transmission rate information 2108 and the detected signal level. The calculator 2503 determines the value of a threshold voltage on the basis of the optimal threshold value and the value of the reference voltage. The calculator 2503 outputs a digital signal representative of the calculated value of the threshold voltage to the D/A converter 2403. The D/A converter 2403 changes the output signal of the calculator 2503 into the threshold voltage. The D/A converter 2403 feeds the threshold voltage to a bit-state detector 2102.

It should be noted that the voltage source 2207 may be replaced by a mean peak detector 2301 of FIG. 34.

Twenty-second Embodiment

Figure 37:
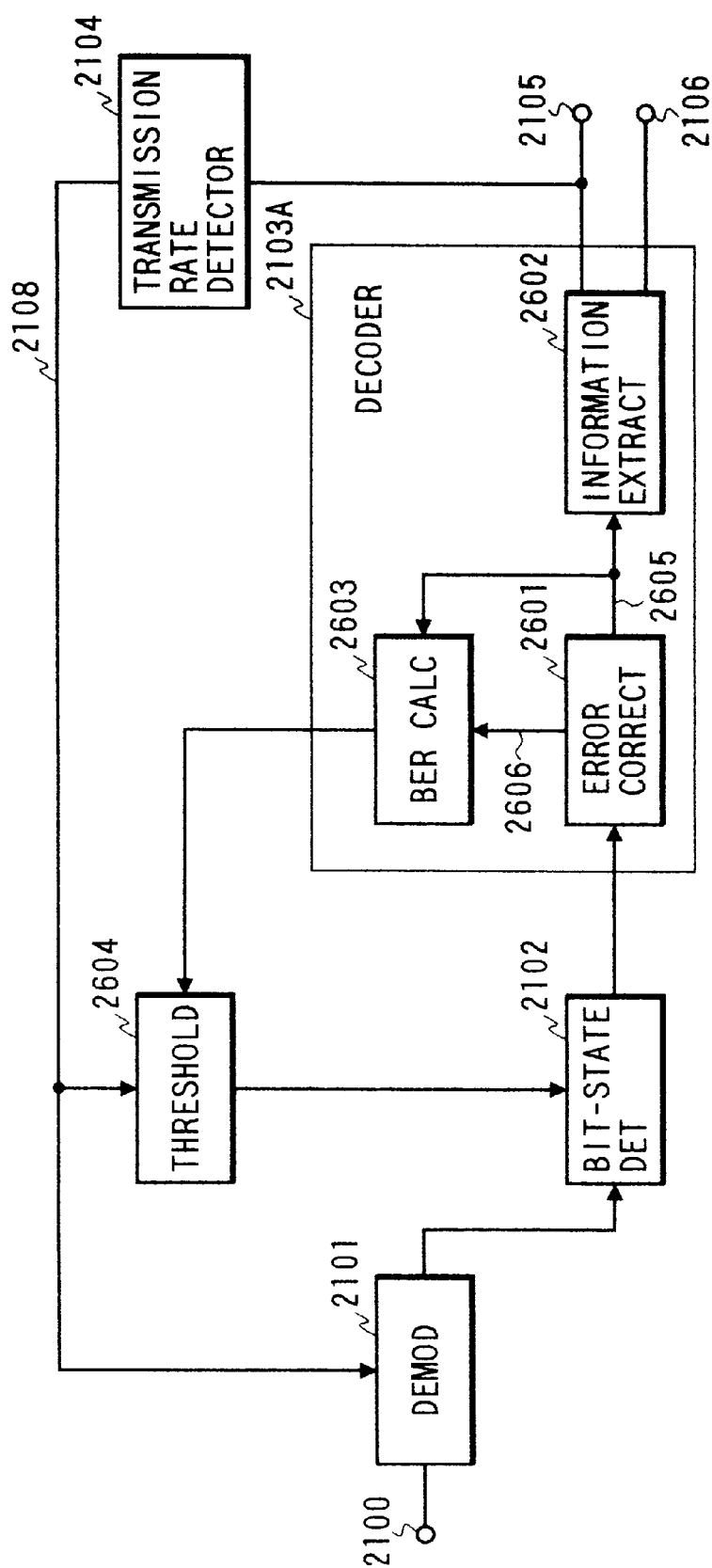
FIG. 37 is a block diagram of an FSK signal receiver according to a twenty-second embodiment of this invention.

FIG. 37 shows a twenty-second embodiment of this invention which is similar to the embodiment of FIG. 33 except that a threshold setting device 2604 replaces the threshold setting device 2105 of FIG. 33, and that a decoder 2103A replaces the decoder 2103 of FIG. 33 and the decoder 2103A is connected to the threshold setting device 2604. An RF multi-value FSK signal handled by the embodiment of FIG. 37 additionally contains error correcting information.

In the embodiment of FIG. 37, the decoder 2103A includes an error correction device 2601, an information extraction device 2602, and a BER (bit error rate) calculator 2603. The error correction device 2601 receives recovered data bits from a bit-state detector 2102, and corrects errors in the recovered data bits by referring to error correcting information therein. The error correction device 2601 outputs resultant error-free data bits 2605 to the information extraction device 2602 and the BER calculator 2603. In addition, the error correction device 2601 informs the BER calculator 2603 of positional information 2606 of data bits which have actually undergone the error correction. For each of different symbol states of an RF multi-value FSK signal, the device 2603 calculates a bit error rate (BER) in response to the error-free data bits 2605 and the error-bit positional information 2606. The device 2603 informs the threshold setting device 2604 of the calculated BER's. The information extraction device 2602 separates the error-free data bits into control information and main information. The information extraction device 2602 feeds the control information and the main information to receiver output terminals 2106 and 2107 respectively. In addition, the information extraction device 2602 feeds the control information to a transmission rate detector 2104.

In the embodiment of FIG. 37, the threshold setting device 2604 receives transmission rate information 2108 from the transmission rate detector 2104. As previously described, the threshold setting device 2604 is informed of the calculated BER's by the BER calculator 2603. The threshold setting device 2604 generates a threshold voltage in response to the transmission rate information 2108 and the calculated BER's. The threshold setting device 2604 outputs the threshold voltage to the bit-state detector 2102.

As shown in FIG. 38, the error-bit positional information 2606 assumes "1" for each error bit, and assumes "0" for each correct bit. The lower portion of FIG. 38 shows an example of the error-free data bits 2605. FIG. 39 shows an example of the relation among the instantaneous frequency of an RF multi-value FSK signal, the corresponding bits (the corresponding symbol state), the error number, the appearance frequency (the frequency of appearance of the corresponding symbol state), and the calculated BER.

As understood from the previous description, the threshold voltage fed to the bit-state detector 2102 from the threshold setting device 2604 is controlled in response to the calculated BER's. The control of the threshold voltage in response to the calculated BER's is designed to equalize BER's for respective different symbol states. In the case where the BER for the symbol state corresponding to the frequency deviation "f2" is considerably greater than the BER's for the other symbol states as shown in FIG. 39, the threshold setting device 2604 lowers the threshold voltage in response to the great BER to reduce a later BER for the symbol state corresponding to the frequency deviation "f2".

The error correction device 2601 may divide the recovered data into a sequence of higher bits (MSB's) and a sequence of lower bits (LSB's) as shown in FIG. 40. In this case, the error correction device 2601 independently subjects a sequence of higher bits and a sequence of lower bits to error correction processes respectively.

A controller may be provided which inhibits the threshold setting device 2604 from changing the threshold voltage under given conditions. A first example of the given conditions is that the calculated BER's for respective different symbol states are very small. A second example of the given conditions is that the error correction device 2601 can not correct errors. A third example of the given conditions Is that the appearance frequencies of respective symbol states are greatly different from each other.

Twenty-third Embodiment

Figure 41:
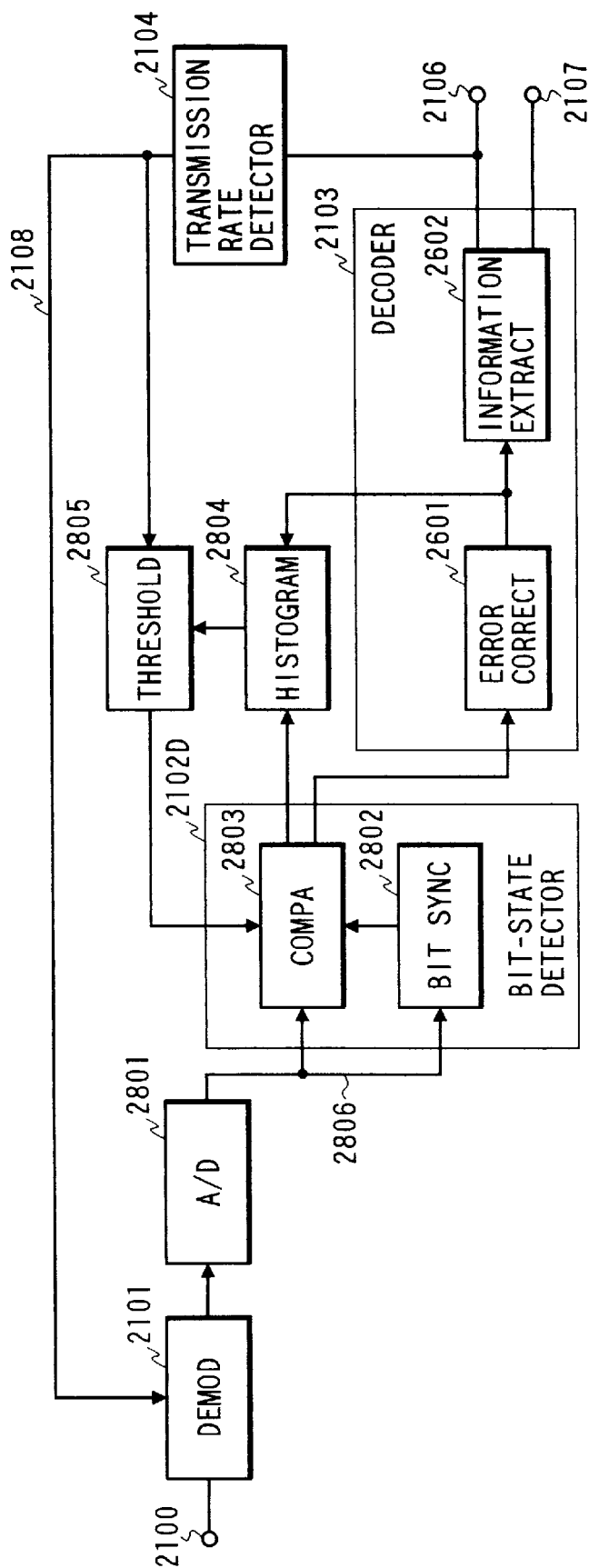
FIG. 41 is a block diagram of an FSK signal receiver according to a twenty-third embodiment of this invention.

With reference to FIG. 41, an FSK (frequency shift keyed) signal receiver includes a demodulator 2101 to which an RF (radio frequency) multi-value FSK signal is fed via a receiver input terminal 2100. The demodulator 2101 is successively followed by an A/D converter 2801, a bit-state detector 2102D, and a decoder 2103. The decoder 2103 is connected to receiver output terminals 2106 and 2107. A transmission rate detector (data rate detector) 2104 is connected to the decoder 2103, the demodulator 2101, and a threshold setting device 2805. The threshold setting device 2805 is connected to the bit-state detector 2102D. A histogram calculator 2804 is connected to the bit-state detector 2102D, the decoder 2103, and the threshold setting device 2805.

An RF multi-value FSK signal handled by the FSK signal receiver of FIG. 41 has the following format. The RF multi-value FSK signal contains control information and main information. Control information is periodically transmitted at predetermined equal intervals. The transmission of the control information is implemented at a given constant rate. Main information is transmitted at a rate designated or represented by control information immediately preceding the main information. The RF multi-value FSK signal additionally contains error correcting information. The RF multi-value FSK signal agrees with, for example, an RF 4-value FSK signal.

The demodulator 2101 outputs a signal having a voltage which is proportional to the instantaneous frequency of the RF multi-value FSK signal. The output signal of the demodulator 2101 is applied to the A/D converter 2801. The output signal of the demodulator 2101 is converted into a corresponding digital signal 2806 by the A/D converter 2801. The A/D converter 2801 outputs the digital signal 2806 to the bit-state detector 2102D.

The bit-state detector 2102D includes a bit sync device 2802 and a comparator 2803 both receiving the output signal 2806 of the A/D converter 2801. The bit sync device 2802 generates a bit sync signal in response to the output signal 2806 of the A/D converter 2801. The bit sync device 2802 outputs the bit sync signal to the comparator 2803 as a timing signal. The device 2803 compares the value represented by the output signal 2806 of the A/D converter 2801 with threshold values to detect bit states for every symbol. The comparator 2803 generates recovered data corresponding to the detected bit states. The comparator 2803 outputs the recovered data to the decoder 2103. The device 2803 executes the comparison at every moment determined by the timing signal. The comparator 2803 transmits the output signal 2806 of the A/D converter 2801 to the histogram calculator 2804 which occurs at every moment of the bit-state detection.

The decoder 2103 includes an error correction device 2601 and an information extraction device 2602. The error correction device 2601 receives the recovered data from the bit-state detector 2102D, and corrects errors in the recovered data by referring to error correcting information therein. The error correction device 2601 outputs resultant error-free data to the information extraction device 2602. In addition, the error correction device 2601 informs the histogram calculator 2804 of the error-free data. The information extraction device 2602 separates the error-free data into control information and main information. The information extraction device 2602 feeds the control information and the main information to the receiver output terminals 2106 and 2107 respectively. In addition, the information extraction device 2602 feeds the control information to the transmission rate detector 2104.

The transmission rate detector 2104 extracts or detects transmission rate information 2108 from the control information. The transmission rate detector 2104 feeds the transmission rate information 2108 to the demodulator 2101 and the threshold setting device 2805.

The demodulator 2101 executes the demodulating process at a rate corresponding to the transmission rate represented by the information 2108.

Figure 42:
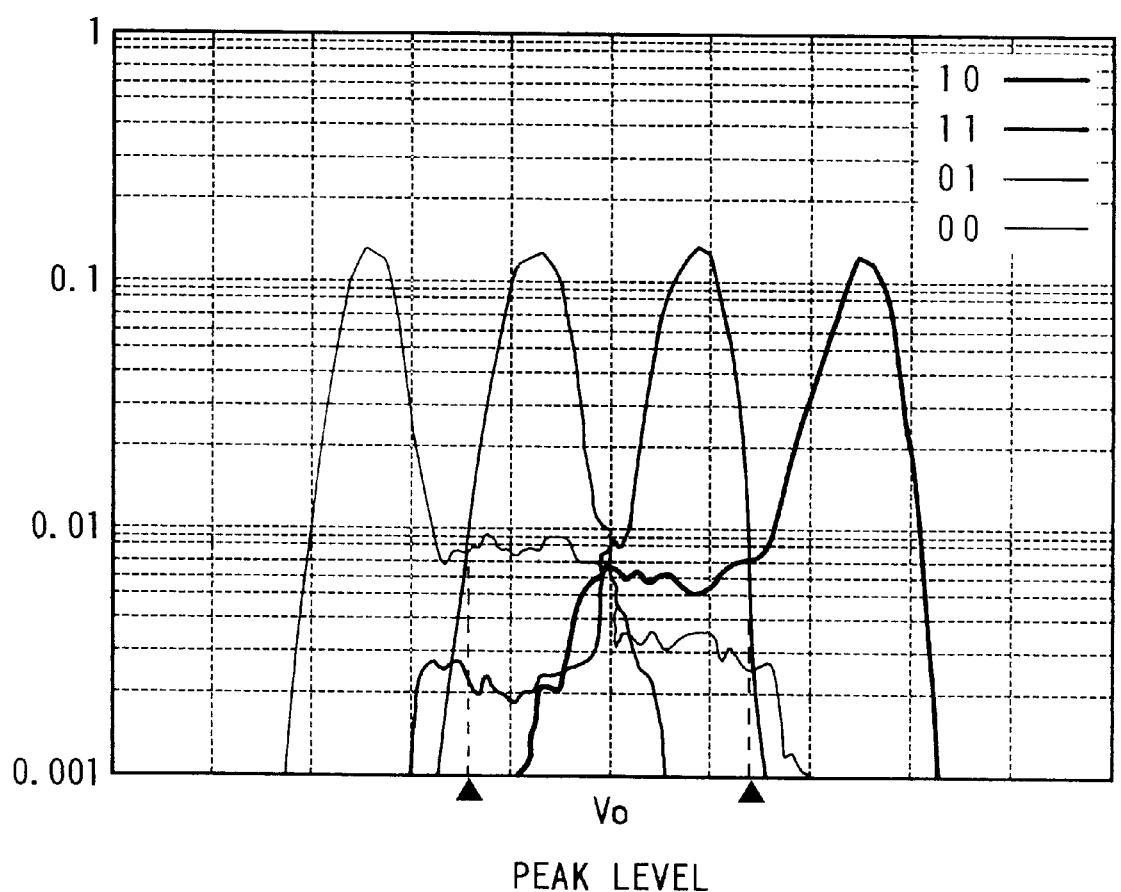
FIG. 42 is a diagram of an example of histograms provided by a histogram calculator in the FSK signal receiver of FIG. 41.

The histogram calculator 2804 uses the error-free data and the output signal 2806 of the A/D converter 2801, thereby providing histograms of the values represented by the output signal 2806 of the A/D converter 2801 which occur at respective moments of the bit-state detection for different symbol states. An example of the provided histograms is shown in FIG. 42. The histogram calculator 2804 informs the threshold setting device 2805 of the provided histograms.

The threshold setting device 2805 sets primary threshold values in response to the transmission rate information 2108. The threshold setting device 2805 corrects the primary threshold values into final threshold values in response to the histograms. Specifically, the final threshold values correspond to the points of intersection between the histograms. In FIG. 42, the points of intersection are denoted by the black triangles. The threshold setting device 2805 feeds the final threshold values to the comparator 2803 within the bit-state detector 2102D.

As understood from the previous description, the threshold values used by the comparator 2803 within the bit-state detector 2102D are controlled in response to the transmission rate information 2108 and also the histograms.

A controller may be provided which inhibits the threshold setting device 2805 from changing the threshold values in response to the histograms under given conditions. A first example of the given conditions is that the error correction device 2601 can not correct errors. A second example of the given conditions is that the appearance frequencies of respective symbol states are greatly different from each other.

What is claimed is:

1. An FSK signal receiver comprising:

a demodulator demodulating a multi-value FSK signal into a voltage signal in response to transmission rate information, the voltage signal having a voltage depending on an instantaneous frequency of the multi-value FSK signal;

an A/D converter converting the voltage signal into a corresponding digital signal, and outputting the digital signal;

a bit sync device generating a bit sync signal from the output signal of the A/D converter;

a bit-state detector including said bit sync device therein;

said bit-state detector detecting a bit state from the output signal of the A/D converter in response to a threshold value at a timing responsive to the bit sync signal, and outputting recovered data corresponding to the detected bit state;

an error correction device correcting errors in the recovered data;

a histogram calculator providing histograms of digital values of the output signal of the A/D converter which occurs at every moment of the bit-state detection by the bit-state detector for respective different symbol states in response to output data from the error correction device;

means for extracting the transmission rate information from the output data of the error correction device, and feeding the transmission rate information to the demodulator; and means for adjusting the threshold voltage used in the bit-state detector in response to the histograms provided by the histogram calculator and also the transmission rate information extracted by the extracting means.

\* \* \* \* \*